United States Patent

Sato et al.

[11] Patent Number: 5,946,251
[45] Date of Patent: Aug. 31, 1999

[54] BIT LINE EQUALIZE CIRCUIT OF SEMICONDUCTOR MEMORY DEVICE

[75] Inventors: Hirotoshi Sato; Yutaka Arita, both of Hyogo, Japan

[73] Assignee: Mitsubishi Denki Kabushiki Kaisha, Tokyo, Japan

[21] Appl. No.: 09/010,037

[22] Filed: Jan. 21, 1998

[30] Foreign Application Priority Data

Jul. 16, 1997 [JP] Japan ................................. 9-191458

[51] Int. Cl.⁶ ................................................ G11C 11/40
[52] U.S. Cl. .......................... 365/203; 365/154; 365/190
[58] Field of Search .................................. 365/203, 154, 365/156, 190

[56] References Cited

U.S. PATENT DOCUMENTS

| 4,868,628 | 9/1989 | Simmons | 257/370 |
| 5,289,409 | 2/1994 | Reinschmidt | 365/154 |
| 5,483,483 | 1/1996 | Choi et al. | 365/177 |
| 5,764,565 | 6/1998 | Sato et al. | 365/154 |

FOREIGN PATENT DOCUMENTS

| 4-285794 | 10/1992 | Japan . |
| 7-29380 | 1/1995 | Japan . |
| 7-226083 | 8/1995 | Japan . |

Primary Examiner—Tan T. Nguyen
Attorney, Agent, or Firm—McDermott, Will & Emery

[57] ABSTRACT

A memory cell data is read/written to a memory cell by utilizing the base current of a bipolar transistor having its emitter coupled to a bit line. When activated, a bit line precharge circuit precharges the bit line to a level of a built-in voltage between the emitter and the base of the memory cell bipolar transistor. When bit lines in a pair are lowered in potential from the H level to the L level, the base electrode node potential of the bipolar transistor is never changed to a negative potential by capacitance coupling, and conduction of an access transistor and destruction of memory cell data are prevented. A semiconductor memory device is implemented which does not cause data destruction and can stably operate at high speed even under a low power supply voltage.

20 Claims, 14 Drawing Sheets

FIG. 8
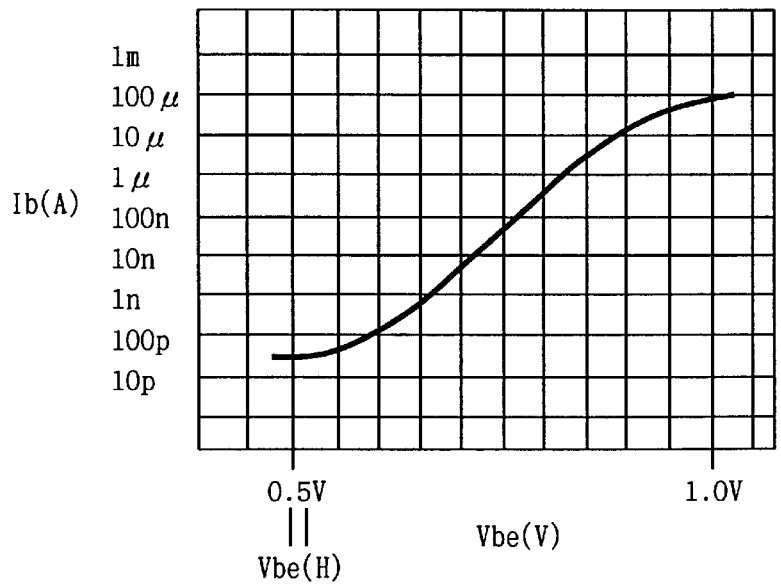
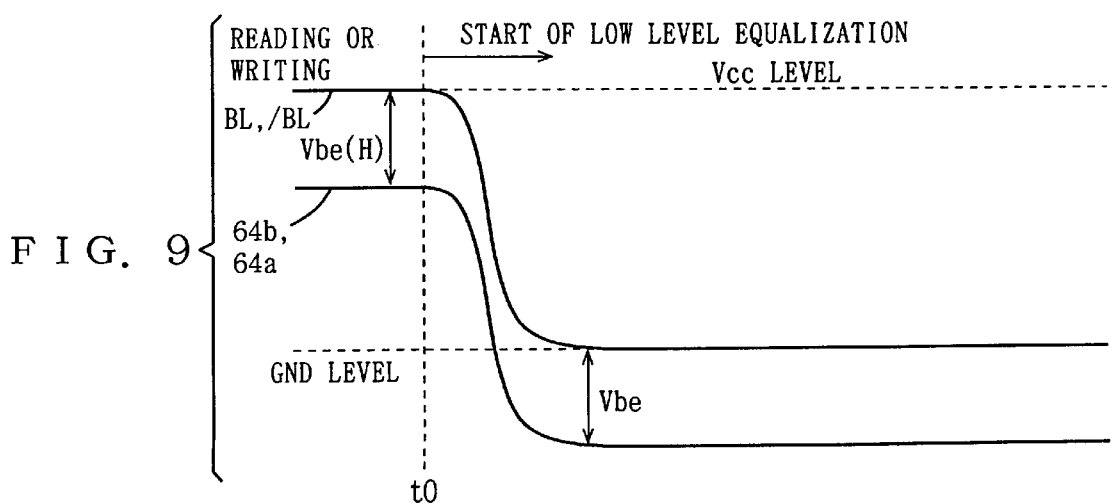
FIG. 9

$\beta ; 1 : 3 \sim 4$

BIT LINE EQUALIZE CIRCUIT OF SEMICONDUCTOR MEMORY DEVICE

BACKGROUND OF THE INVENTION

1. Field of the Invention

The present invention relates to a semiconductor memory device and more particularly to a static type semiconductor memory device. More specifically, the present invention relates to a structure of a bit line precharge/equalize circuit of a static random access memory.

2. Description of the Background Art

FIG. 21 schematically shows a structure of an array portion of a conventional static semiconductor memory device. The structure of a static random access memory (SRAM) as the static type semiconductor memory device shown in FIG. 21 is described, for example, in Japanese Patent Laying-Open No. 7-226083.

In FIG. 21, the SRAM includes a plurality of memory cells M arranged in a matrix, a plurality of word lines WL each arranged corresponding to a row of memory cells and connecting memory cells of a corresponding row, and a plurality of pairs of bit lines BL, /BL each arranged corresponding to a column of memory cells and connecting memory cells of a corresponding column. FIG. 21 representatively shows a word line WL1, bit line pairs BL1, /BL1–BLn, /BLn, and memory cells M1–Mn arranged corresponding to the crossings of word line WL1 and bit line pairs BL1, /BL1–BLn, /BLn.

Memory cells M1–Mn each include an inverter latch formed of inverters 202 and 203 for storing complementary data in storage nodes SN and /SN, and access transistors 204 and 205 rendered conductive to connect storage nodes SN and /SN to corresponding bit lines BL, /BL (BL1, /BL1–BLn, /BLn) in response to a signal potential of word line WL (WL1). Access transistors 204 and 205 are n channel MOS transistors (insulated gate type field effect transistors).

The SRAM further includes: bit line precharge/equalize circuits BEQ1–BEQn provided corresponding to respective bit line pairs BL1, /BL1–BLn, /BLn, and activated upon activation of a bit line equalize instruction signal /EQ for precharging and equalizing corresponding bit line pairs BL1, /BL1–BL1n, /BLn to a power supply voltage Vcc level; column selection gates CSG1–CSGn provided corresponding to respective bit line pairs BL1, BL1–BLn, /BLn, receiving a column selection signal Y (Y1–Yn) from a column decoder, not shown, and rendered conductive to electrically connect a corresponding bit line pair to internal read data bus lines DB, /DB when the received column selection signal designates the corresponding bit line pair; and a sense amplifier 215 activated at the time of data reading, for amplifying the signal potentials of internal read data bus lines DB, /DB to generate internal read data, and transferring them to a data output circuit, not shown.

Bit line precharge/equalize circuits BEQ1–BEQn each include a p channel MOS transistor 206 rendered conductive to transfer a power supply voltage Vcc to bit line BL (BL1–BLn) when bit line equalize instruction signal /EQ is activated, a p channel MOS transistor 207 rendered conductive to transfer the power supply voltage Vcc to bit line /BL (/BL1–/BLn) when bit line equalize instruction signal /EQ is activated, and a p channel MOS transistor 208 rendered conductive to electrically connect bit lines BL and /BL when bit line equalize instruction signal /EQ is activated.

Column selection gates CSG1–CSGn each include an inverter circuit 210 inverting column selection signal Y (Y1–Yn), a CMOS transmission gate 211 rendered conductive to connect corresponding bit line BL (BL1–BLn) to internal read data bus line DB in accordance with column selection signal Y1 and an output signal from inverter circuit 210, and a CMOS transmission gate 212 rendered conductive to connect corresponding bit line /BL (/BL1–/BLn) to internal read data bus line /DB in accordance with column selection signal Y1 and the output signal from inverter circuit 210.

Sense amplifier 215 includes a structure of a differential amplifier circuit and generates internal read data by differentially amplifying complementary data which appear on internal read data bus lines DB and /DB. Now, the data reading operation of the SRAM shown in FIG. 21 will be described with reference to a waveform diagram shown in FIG. 22.

At the time of data reading, bit line equalize instruction signal /EQ is at an H level inactive state. By driving bit line equalize/precharge circuits BEQ1–BEQn to an inactive state at the time of data reading, an accurate data reading is accomplished.

When an address signal is applied, a row decoder and a column decoder which are not shown operate in accordance with this applied address signal, and a word line corresponding to an addressed row and column selection signal Y corresponding to an addressed column are driven to the selected state. As an example, FIG. 22 shows the case in which word line WL1 is selected. In accordance with a rise of the potential of word line WL1, respective access transistors 204 and 205 of memory cells M1–Mn which are connected to this word line WL1 are rendered conductive, and storage nodes SN and /SN are connected to corresponding bit lines BL and /BL (BL1, BL1–BLn, /BLn).

When corresponding memory cells are not selected, bit line precharge/equalize circuits BEQ1–BEQn are active and they supply current to corresponding bit lines. On the other hand, bit line precharge/equalize circuits BEQ1–BEQn are inactivated when their corresponding memory cells are selected. The current which has been supplied from bit line precharge/equalize circuits BEQ1–BEQn to each bit line flows in the storage nodes storing an L level in memory cells M1–Mn, causing a potential difference between bit lines BL and /BL.

Along with row selection, a bit line pair corresponding to a selected column is connected to read data bus lines DB, /DB in accordance with column selection signal Y. Storage nodes SN and /SN hold complementary data. Now, the case is assumed in which memory cell M1 is selected and its storage node SN stores data of an H level. In this case, current (column current) flows from bit line /BL1 to storage node /SN of memory cell M1, and the voltage level of bit line BL1 is lowered. Meanwhile, storage node SN stores the H level and the voltage level of bit line BL1 is hardly changed.

The potential difference caused between bit lines BL1 and /BL1 is transferred through column selection gate CSG1 to internal read data bus lines DB, /DB. Sense amplifier 215 is activated at prescribed timing to amplify a potential difference caused between internal read data lines DB, /DB for generating internal read data.

When the reading operation of memory cell data is completed, the potential of selected word line WL1 is driven to the L level, and column selection signal Y1 also falls to the L level inactive state. Thus, bit lines BL1, /BL1 are isolated from internal read data bus lines DB, /DB. Since word line WL1 attains the non-selected state, access transistors 204 and 205 of memory cells M1–M*n* are at the non-conductive state, and bit lines BL1, BL1–BL*n*, /BL*n* are precharged to their original power supply voltage Vcc level by corresponding bit line precharge/equalize circuits BEQ1–BEQ*n*.

At the time of data writing, bit line equalize instruction signal /EQ is driven to the H level inactive state, and bit line precharge/equalize circuits BEQ1–BEQ*n* are kept at the inactive state. When word line WL1 is selected, memory cells M1–M*n* are connected to corresponding bit lines BL1, /BL1–BL*n*, /BL*n*. The potential of a bit line slightly changes according to data stored in memory cells M1–M*n*. Along with word line selection, the column selection operation is performed. Column selection signal Y corresponding to a selected column is activated, and a bit line pair corresponding to the selected column is connected to a write circuit which is not shown. Further, complementary data are transferred from this write circuit to selected bit lines BL and /BL. As a result, data stored in storage nodes SN and /SN of a memory cell attain potential levels corresponding to the write data. After data writing is completed, as in the case of data reading, the word line is driven again to the non-selected state and column selection signal Y is also inactivated, thus ending the data writing operation. Then, bit line equalize instruction signal /EQ is activated to precharge the potentials of bit lines BL, /BL to their original power supply voltage level.

FIG. 23 shows an example of the specific structures of memory cells M1–M*n* shown in FIG. 21. Since memory cells M1–M*n* have the same structure, the reference character M is representatively used in FIG. 23.

In FIG. 23, memory cell M includes a high-resistance resistive element 220 connected between a power supply node supplying a power supply voltage Vcc and a storage node /SN, a driver transistor 221 formed of an n channel MOS transistor connected between storage node /SN and a ground node supplying a ground voltage GND and having its gate connected to a storage node SN, a high-resistance resistive element 222 connected between the power supply node and storage node SN, a driver transistor 223 connected between storage node SN and the ground node and having its gate connected to storage node /SN, and access transistor 204 formed of an n channel MOS transistor rendered conductive to connect storage node SN to bit line BL in response to the signal potential of word line WL, and an access transistor 205 formed of an n channel MOS transistor rendered conductive to connect storage node /SN to bit line /BL in response to the signal potential of word line WL.

High-resistance resistive element 220 and driver transistor 221 correspond to inverter 202 of the memory cell shown in FIG. 21, while high-resistance resistive element 222 and driver transistor 223 correspond to inverter 203 of the memory cell shown in FIG. 21. When H level data is stored in storage node SN, driver transistor 221 is on, and storage node ISN is kept at the ground potential level (the current drivability of high-resistance resistive element 220 is extremely low). Since storage node /SN is driven to the L level, driver transistor 223 is off, and storage nodes SN and /SN are kept at the H and L levels, respectively. If high-resistance resistive elements 220 and 222 are formed of polysilicon resistors, for example, high-resistance resistive elements 220 and 222 can be formed in an upper layer of respective driver transistors 221 and 223. As a result, the area occupied by the memory cell can be reduced.

The resistance value of a high-resistance resistive element is sufficiently larger than the ON resistance (channel resistance) of access transistors 204 and 205 as well as that of driver transistors 221 and 223. Therefore, when word line WL is selected and thus access transistors 204 and 205 are rendered conductive, the transfer factor βb (the ratio of a channel width Wb and a channel length Lb) of driver transistors 221 and 223 has to be set to be more than three times the transfer factor β of access transistors 204 and 205 in order to reliably hold stored data in storage nodes SN and /SN, as described below in detail. The reason why the transfer factor of a driver transistor should be larger than the transfer factor of an access transistor in order to reliably hold memory cell data will be described below.

The input/output characteristic of an inverter I as shown in FIG. 24A will be discussed here. Inverter I inverts an input signal IN and generates an output signal OUT. Therefore, the input/output characteristic of inverter I is represented by a curve as shown in FIG. 24B. Since output signal OUT makes a quick transition according to a transition of input signal IN as the gain of inverter I becomes larger, the transition of the input/output characteristic curve shown in FIG. 24 becomes steeper. The gain of inverter I is determined by the current drivability of its components, MOS transistors.

As shown in FIG. 25A, a memory cell of an SRAM stores data in its storage nodes SN and /SN by an inverter latch. Here, inverter 202 inverts the signal potential of storage node SN for transference to storage node /SN, while inverter 203 inverts the signal potential of storage node /SN for transference to storage node SN. When inverters 202 and 203 have the same input/output transfer characteristic, an input/output data characteristic curve which is axially symmetrical is obtained as shown in FIG. 25B. This axial symmetry indicates that input IN and output OUT of an inverter are the same.

In FIG. 25B, the abscissa denotes the signal potential of storage node SN and the ordinate denotes the potential of storage node /SN. Further, the curve A1 indicates the input/output transfer characteristic of inverter 202 and the curve A2 indicates that of inverter 203. The points S1 and S2 corresponding to the crossings of these curves A1 and A2 are stable points for this inverter latch. The voltages corresponding to one of these stable points S1 and S2 are provided at storage nodes SN and /SN.

In order to stably operate the inverter latch, the curves A1 and A2 shown in FIG. 25B require two stable points S1 and S2. The point PM is a meta-stable point. Even if the voltages provided to storage nodes SN and /SN are initially the voltages corresponding to the metastable point PM, the latched state will be shifted to the stable point SE1 or S2 due to some noise.

In order to ensure that the inverter latch formed of inverters 202 and 203 stably operates and reliably holds the potentials of storage nodes SN and /SN, the area surrounded by the curves A1 and A2 (static noise margin SNM) should be made larger. When this area ("eyes" of the characteristic curves) is small, the curves A1 and A2 come closer to each other and their adjacent point simulatively acts as a stable point. Therefore, an arbitrary intermediate potentials can be held as a stable point in storage nodes SN and /SN and correct data cannot be held.

In the structure of an inverter latch of a memory cell, the manner of connection varies according to the selected and non-selected states. Now, consider the manner of connection when SRAM memory cell M is at a standby state (where the word line is in the non-selected state) as shown in FIG. 26A. In the standby state, access transistors 204 and 205 are off as shown in FIG. 26A. In this state, storage nodes SN and /SN are connected through high-resistance resistive elements 222 and 220 to the power supply node. Inverter 202 is formed of resistive element 220 and driver transistor 221, while inverter 203 is formed of resistive element 222 and driver transistor 223. In the case of an inverter using this high-resistance resistive element, the conductive state of a driver transistor causes its output node to be discharged at high speed because the current supplying capability of the high-resistance resistive element is extremely low. In this case, therefore, the transfer characteristic curves A1 and A2 of inverters 202 and 203 come to have steep falls and rises as shown in FIG. 26B, and thus data is stably hold.

FIG. 27A shows connection of each transistor of a memory cell where the corresponding word line is selected. When the word line is selected, access transistors 204 and 205 are turned on and storage nodes SN and /SN are connected to corresponding bit lines BL and /BL. Bit lines BL and /BL are connected to a bit line load circuit which is a current source (precharge circuit), and current flows from a corresponding bit line to that storage node out of storage nodes SN and /SN which holds the L level potential.

Therefore, this state is equivalent to a structure in which a low impedance load is connected in parallel with the high-resistance resistive elements, and thus to a structure in which high-resistance resistive elements 220 and 222 do not exist. In this state, inverters 202 and 203 should be treated as NMOS enhancement load type inverters using access transistors 204 and 205 as a load. As compared with the structure using the high-resistance resistive elements, the transition of a transition part of the input/output transfer characteristic curve is moderate and the gain of an inverter decreases, because current is supplied from the NMOS enhancement load type transistors. As shown in FIG. 27B, therefore, the area formed by the curves A1 and A2 becomes smaller and the static noise margin is accordingly reduced.

Then, consider the case in which access transistors 204 and 205 and driver transistors 221 and 223 have the same current drivability. In this case, the amount of current discharged from a conductive driver transistor (for example, transistor 223) is equal to the amount of current supplied to an access transistor (for example, transistor 204), and the input/output transfer characteristic of inverters 202 and 203 becomes quite moderate. As shown in FIG. 27C, this state comes to be closer to the state in which the curves A1 and A2 have only one stable point. In short, when an access transistor and a driver transistor have the same current drivability, the conductance of the access transistor and that of the driver transistor which holds the L level data are the same when a word line is selected. Thus, the potential of a storage node holding this L level is increased, which starts to render conductive the other driver transistor holding the H level, thus decreasing the potential of a storage node storing this H level. In this case, the stored data is destructed upon word line selection.

Stable points S1 and S2 are the operational points of a flipflop formed of these inverters, and this flipflop is held at either stable point. Therefore, when the input/output transfer characteristic makes a transition as shown in FIG. 27C, there is no bi-stable point and this leads to destruction of data stored in storage node SN and ISN at the time of word line selection. In order to ensure that the two stable points exist even at the time of word line selection, it is necessary to prevent the potentials of storage nodes SN and /SN from shifting to an intermediate potential level. In other words, it is necessary to reduce the ratio of the current drivability (conductance) of an access transistor and the current drivability (conductance) of a driver transistor.

Normally, the current drivability of a driver transistor is set three times as large as that of an access transistor. The current drivability (conductance) of an MOS transistor is proportional to the ratio β of a channel width W and a channel length L. Destruction of stored data at the time of data reading is prevented by setting the ratio (cell ratio) of the current drivability to the value of 3 or 4 and ensuring that the input/output transfer characteristic of an inverter is comparatively steep even at the time of word line selection and that two stable points exist.

In order to ensure that the transfer factor β of driver transistors 221 and 223 is larger than that of access transistors 204 and 205, the channel width of driver transistors 221 and 223 should be larger than that of access transistors 204 and 205. If only their respective channel length is reduced, it causes a short channel effect lowering a threshold voltage and an increased current consumption. Further, the size of driver transistors becomes large. Therefore, the memory size (occupied area) cannot be reduced and it becomes an obstacle against higher integration.

Further, at the time of data reading, current (column current) always flows from a bit line to a memory cell connected to a selected word line, and thus current consumption at the time of data reading is undesirably large.

The operational power supply voltage tends to be lowered because of high speed operation and low current consumption. An MOS transistor can supply a larger drain current as its gate voltage becomes higher. This is apparent because the drain current of MOS transistor which is in a saturated region can be represented by the following expression.

$$Ids = \beta(Vgs - Vth)^2$$

Here, Vgs is a gate-to-source voltage, and Vth is a threshold voltage. Therefore, when the power supply voltage is lowered, the gate-to-source voltage Vgs is also lowered, decreasing the amount of driving current. Thus, when the operational power supply voltage is lowered, the input/output transfer characteristic of an inverter is moderate in its transition, and the input/output transfer characteristic as shown in FIG. 27C is provided and stored data is destroyed at the time of data reading (word line selection).

Since current is always supplied through a resistive element especially in an SRAM memory cell, the threshold voltage of driver transistors 221 and 223 is set higher than that of access transistors so as to minimize the current consumption. Therefore, when the operational power supply voltage is lowered, a difference between the current drivability of driver transistors 221 and 223 and the current drivability of access transistors 204 and 205 when rendered conductive is decreased, and the condition that the cell ratio is set to the value of 3 or 4 cannot be satisfied. In this case, a transition of the curves A1 and A2 is very moderate as shown in FIG. 27D. Therefore, there is no stable point but a pseudo stable point. Stored data is destroyed at the time of word line selection, thus preventing correct data reading.

SUMMARY OF THE INVENTION

An object of the present invention is to provide a semiconductor memory device in which a memory cell is accessed without destruction of its storing data.

Another object of the present invention is to provide a semiconductor memory device allowing data writing/reading at high speed while stably holding data even under a low power supply voltage.

A semiconductor memory device according to the present invention includes a bit line pair, a word line arranged to cross the bit line pair, and a memory cell arranged corresponding to a crossing of the bit line pair and the word line. This memory cell includes: a flipflop including cross-coupled insulated gate type field effect transistors for storing complementary data in a pair of storage nodes; a pair of bipolar transistors provided corresponding to a bit line pair and each having one conduction node connected to a corresponding bit line, the other conduction node connected to a first voltage source supplying a first power supply voltage, and a base electrode node: and a pair of access transistors provided corresponding to a pair of storage nodes and a pair of bipolar transistors, selectively rendered conductive in response to a signal potential of the word line, and connecting the base electrode of a corresponding bipolar transistor to a corresponding storage node when rendered conductive.

The semiconductor memory device according to the present invention further includes: write circuitry activated when data is written to a memory cell, for driving each bit line of the bit line pair to a second power supply voltage level which is different from the first power supply voltage; and a bit line precharge circuit coupled to each bit line of the bit line pair and activated upon activation of a bit line precharge instruction signal for precharging each bit line of the bit line pair to a prescribed potential level between an intermediate potential which is between the first and second power supply potentials and the first power supply potential. The intermediate potential is substantially equal to a built-in voltage between the one conductive node and the base electrode node of the bipolar transistor.

When selected, the storage nodes of the memory cell are connected through bipolar transistors to bit lines. The base current of the bipolar transistor is supplied to the storage node through the access transistor. The base current is determined by the current amplification rate of the bipolar transistor and can be made sufficiently smaller. The base current is supplied to the first voltage source through the driver transistor of the flipflop in the memory cell. At the time of word line selection, therefore, data in the storage node can stably be held even if the access transistor and the driver transistor have almost the same transfer factor β. Thus, data destruction is prevented and data can stably be held even under a low power supply voltage.

By the use of a precharge voltage at the built-in voltage level, even if capacitive coupling of junction capacitance in the bipolar transistor causes a change in the base electrode node potential of the bipolar transistor when the bit line potential is returned to the precharge voltage, only a small voltage transition of the built-in voltage between the base of the bipolar transistor and the bit line is caused when the word line is shifted from the selected state to the non-selected state. This transition of the base electrode node potential of the bipolar transistor caused by capacitive coupling prevents the access transistor to be rendered conductive and avoids destruction of stored data. Therefore, data can stably be hold.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows the relation between an emitter-to-base voltage and a base current of a bipolar transistor.

FIG. 9 shows a potential transition of a base electrode node of a bipolar transistor when a bit line is precharged.

DESCRIPTION OF THE PREFERRED EMBODIMENTS

First Embodiment

Figure 1:
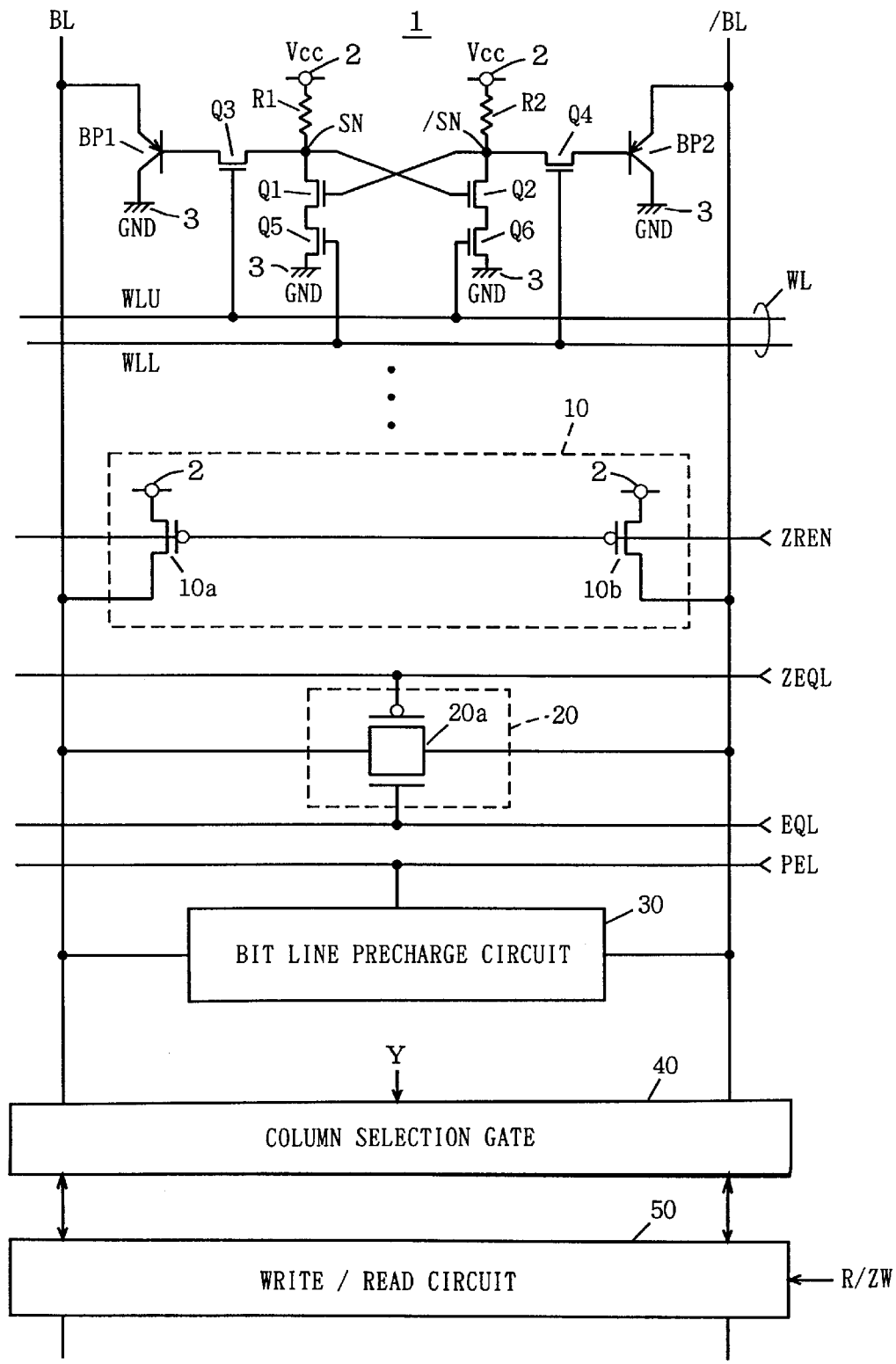
FIG. 1 shows a structure of a main part of a semiconductor memory device according to an embodiment of the present invention.

FIG. 1 schematically shows a structure of a main part of a semiconductor memory device (SRAM) according to a first embodiment of the present invention. In FIG. 1, the structure of a part related to a pair of bit lines BL and /BL is schematically shown. A memory cell 1 is arranged corresponding to a crossing of bit lines BL and /BL and a word line WL. Word line WL includes a pair of sub-word lines WLU and WLL.

Memory cell 1 includes: a high resistance resistive element R1 connected between a power supply node 2 supplying a power supply voltage Vcc and a storage node SN; a high resistance resistive element R2 connected between power supply node 2 and a storage node /SN; cross-coupled driver transistors Q1 and Q2 formed of n channel MOS transistors for holding complementary data in storage nodes SN and /SN; a pnp bipolar transistor BP1 having its emitter connected to bit line BL and its collector connected to a voltage source (ground node) 3 supplying a ground voltage GND as a first power supply voltage; a pnp bipolar transistor BP2 having its emitter connected to bit line /BL and its collector connected to ground node 3; an access transistor Q3 formed of an n channel MOS transistor rendered conductive to electrically connect the base electrode node of bipolar transistor BP1 to storage node SN when a signal potential of sub-word line WLU is at an H level; an access transistor Q4 formed of an n channel MOS transistor rendered conductive to connect storage node /SN to the base electrode node of bipolar transistor BP2 when a signal potential of sub-word line WLL is at the H level; a cut transistor Q5 formed of an n channel MOS transistor rendered conductive to connect one conduction node (source) of driver transistor Q1 to ground node 3 in response to the signal potential of sub-word line WLL; and a cut transistor Q6 formed of an n channel MOS transistor rendered conductive to electrically connect the source of driver transistor Q2 to ground node 3 in response to the signal potential of sub-word line WLU.

For a pair of bit lines BL and /BL, provided are a read load circuit 10 supplying current from power supply node 2 to bit lines BL and /BL in response to activation of a read enable signal ZREN at the time of data reading, a bit line equalize circuit 20 activated in response to activation of bit line equalize instruction signals EQL and ZEQL for equalizing the potentials of bit lines BL and /BL, a bit line precharge circuit 30 activated in response to activation of a bit line precharge instruction signal PEL for precharging bit lines BL and /BL to a prescribed low potential level, a column selection gate 40 selecting bit lines BL and /BL in accordance with a column selection signal Y. and a write/read circuit 50 writing/reading data to and from bit lines BL, /BL selected by column selection gate 40. Write/read circuit 50 performs data writing or reading in response to a write/read instruction signal R/ZW. Write/read circuit 50 includes a sense amplifier, for example, and it also includes a write driver or a write gate as a write circuit. The data writing/reading circuitry of the memory cell shown in FIG. 1 will be described later.

The data writing/reading operation of the memory cell shown in FIG. 1 will be described.

Figure 2:
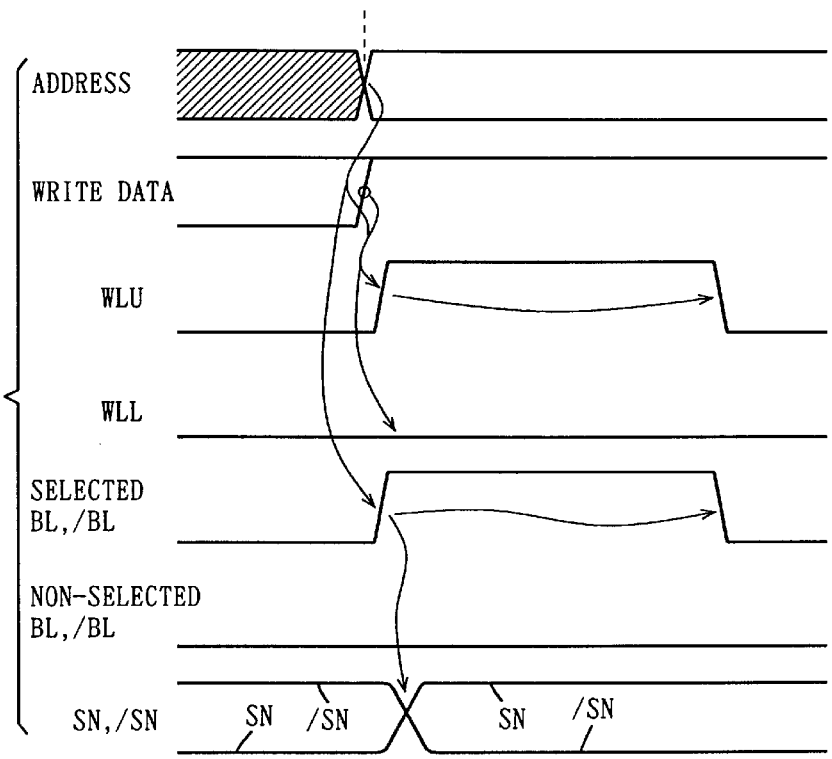
FIG. 2 is a signal waveform diagram illustrating the operation of the semiconductor memory device shown in FIG. 1 at the time of data writing.

First, the data writing operation will be described with reference to FIG. 2. In the SRAM, a word line and a bit line pair are selected in accordance with an address transition. Now, the case is considered in which L level data is held in storage node SN and H level data is to be written to storage node SN. When an address signal makes a transition, the selection operation of a word line and a bit line pair is performed in accordance with this address signal. When the data to be written is at the H level, word line WL corresponding to an addressed row is driven to the selected state, sub-word line WLU of selected word line WL is driven to the H level while sub-word line WLL is kept at the L level in accordance with the data. Thus, access transistor Q3 is turned on, and access transistor Q4 maintains the off state. Further, write/read circuit 50 drives bit lines BL and /BL to the H level through column selection gate 40.

Cut transistors Q5 and Q6 are at the off and on states, respectively. Here, the "on state" indicates a completely conductive state while the "off state" indicates a completely non-conductive state in which only leakage current is caused. When the potential of bit line BL is raised and bipolar transistor BP1 has its emitter to base forwardly biased, bipolar transistor BP1 is rendered conductive and a collector current flows from bit line BL through bipolar transistor BP1 to ground node 3. When this collector current flows, a base current also flows from bipolar transistor BP1 to storage node SN. Cut transistor Q5 is at the off state, and the potential of storage node SN is raised by the base current of bipolar transistor BP1.

Since cut transistor Q6 is at the on state, driver transistor Q2 is rendered conductive to drive storage node /SN to a ground voltage GND level when the potential of storage node SN becomes higher than the threshold voltage of driver transistor Q2. In accordance with the potential drop of storage node /SN, driver transistor Q1 is brought into the off state and the base current of bipolar transistor BP1 is cut off. The potential of storage node SN is raised by the base current of bipolar transistor BP1. The potential of storage node SN is raised while the emitter-to-base voltage of bipolar transistor BP1 is kept at an almost fixed value. In bipolar transistor BP1, at the time of writing, a relatively large collector current flows and thereafter the base current at the order of a small leakage current only flows.

Access transistor Q4 is at the off state, and storage node /SN is discharged to the ground voltage GND level in accordance with the voltage increase of storage node SN. The H level data is written to storage node SN and the L level data is written to storage node /SN.

When data writing is completed, the potential of sub-word line WLU is lowered to the L level, and access transistor Q3 and cut transistor Q6 are turned off. In this case, storage nodes SN and /SN are coupled to power supply node 2 through high resistance resistive elements R1 and R2. The H level data of storage node SN is reliably held at the H level. On the other hand, the current drivability of high resistance resistive elements R1 and R2 is extremely low to the extent that the leakage current of storage nodes SN and /SN is compensated for, and storage node /SN holds the L level data which is almost at the ground voltage GND level.

Figure 3:
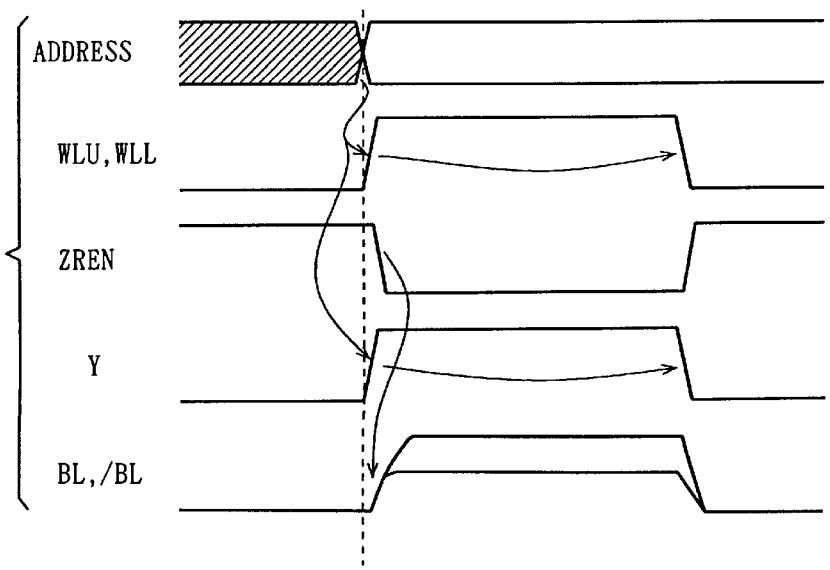
FIG. 3 is a signal waveform diagram illustrating the operation of the semiconductor memory device shown in FIG. 1 at the time of data reading.

The data reading operation will be described now with reference to FIG. 3.

Bit lines BL and /BL have been precharged to the L level, that is, the ground potential level, by bit line precharge circuit 30 and equalize circuit 20. When an address signal makes a transition, a word line and a bit line pair are selected. At the time of data reading, sub-word lines WLU and WLL are both raised to the H level, and transistors Q3 and Q4 are both turned on to electrically connect storage nodes SN and /SN to the base electrode nodes of bipolar transistors BP1 and BP2. Read enable signal ZREN is activated at prescribed timing and p channel MOS transistors 10a and 10b of read load circuit 10 are turned on, supplying current to bit lines BL and /BL. As a result, the potentials of bit lines BL and /BL are raised.

Now, the case is considered in which L level data is held in storage node SN. In this case, when the potential of bit line BL becomes higher than the emitter-to-base voltage (built-in voltage) of bipolar transistor BP1, bipolar transistor BP1 has its emitter to base forwardly biased. Thus, bipolar transistor BP1 is rendered conductive to supply a large collector current, suppressing the potential increase of bit line BL. The current supplying capability of MOS transistor 10a is the same or larger as compared with the current supplying capability of bipolar transistor BP1, and the potential of bit line BL is almost kept at the potential level of this built-in voltage Vbe (approximately 0.7–1.1 V). On the other hand, bipolar transistor BP2 having its base electrode node connected to storage node /SN2 which holds H level data will not have its emitter to base forwardly biased even if the potential of bit line /BL is raised, and bit line /BL is raised to the H level (power supply voltage level). Thus, bipolar transistor BP2 is kept at almost the off state. The potential difference caused between bit lines BL and /BL is transferred to write/read circuit 50 through column selection gate 40 and amplified to generate internal read data.

At the time of data reading, a base current flows through the bipolar transistor to storage node storing the L level data. However, this base current is of a small value and it can be made sufficiently smaller than the current drivability of the driver transistor and the cut transistor. The magnitude of the base current is determined by the current amplification rate hFE of bipolar transistors BP1 and BP2. If the ratio of a current Id supplied through the driver transistor and cut transistor and a base current Ib is 3:1, memory cell 1 can stably store information. Therefore, from the relation of the base and collector currents, the memory cell can stably hold data if a collector current Ic passed through a bit line and drain current Id through the driver transistor and the cut transistor satisfies the following relation.

$$Id \geq 3 \cdot Ic/(1+hFE)$$

For example, when power supply voltage Vcc=1.8 V, collector current Ic=100 µA, and current amplification rate hFE=10, drain current Id is given by the following expression.

$$Id \geq 3 \cdot 100 \mu A/(10+1) = 27 \mu mA$$

Therefore, under the condition that power supply voltage Vcc is 1.8 V, the memory cell can stably hold data if the current drivability of 27 µA as drain current Id is attained in driver transistors Q1 and Q2. Even if relatively larger collector current Ic is supplied from the read load circuit to quickly raise the bit line potential, base current Ib can be made sufficiently smaller and the memory cell data can reliably be held.

At the time of data reading, relatively large current is passed through bit line BL. However, by providing a latch circuit and turning off current supply elements 10a and 10b in the read load circuit, the collector current is produced only for a prescribed period during data reading and thus the current consumption at the time of data reading can be reduced.

Now, a structure of each internal signal generation portion will be schematically described.

Figure 4:
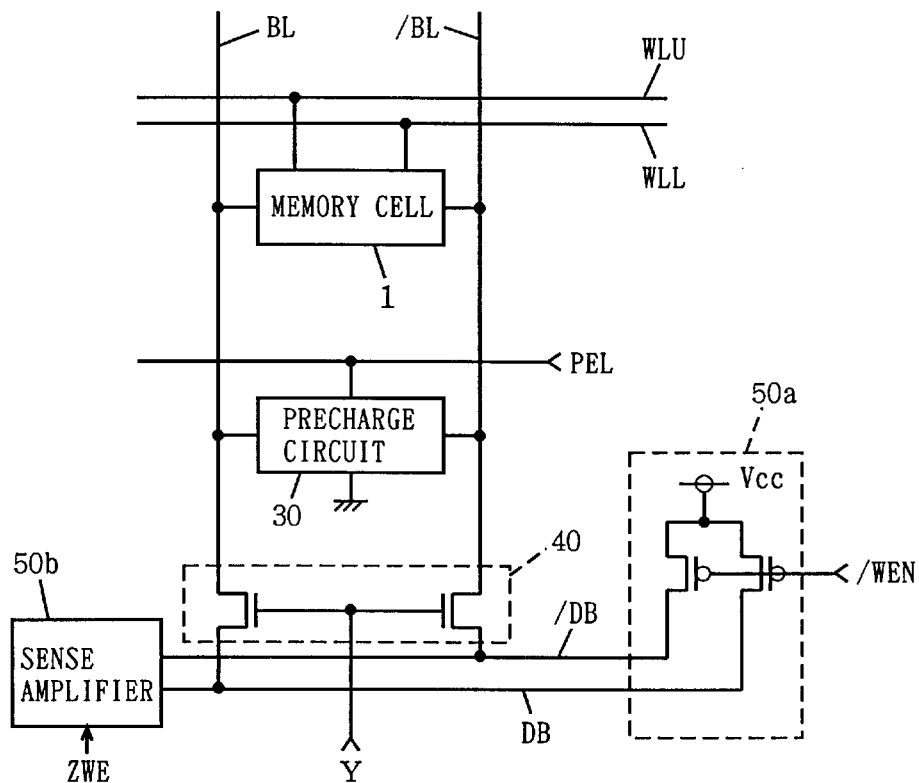
FIG. 4 shows an example of a structure of a data writing/reading portion of the semiconductor memory device shown in FIG. 1.

FIG. 4 shows an example of a structure of write/read circuit 50 shown in FIG. 1. In FIG. 4, bit lines BL and /BL are connected to common data bus lines DB and /DB through column selection gate 40. Write/read circuit 50 includes a write circuit 50a which transfers power supply voltage Vcc to internal data bus lines DB and /DB in response a write enable signal /WEN which is activated upon activation of a positive logic write enable signal ZWE, and a sense amplifier 50b activated upon inactivation of write enable signal ZWE and differentially amplifying data of common data bus lines DB and /DB. Write circuit 50 includes p channel MOS transistors provided for respective data bus lines DB and /DB and having their respective gates receiving write enable signal /WEN. Sense amplifier 50b is activated when write enable signal ZWE is inactive and indicates the data reading operation, for differentially amplifying the signal potentials of common data bus lines DB and /DB.

When write enable signal ZWE is activated, write enable signal /WEN is driven to the L level active state at prescribed timing and kept at the L level for a prescribed period. In the structure shown in FIG. 4, write circuit 50a and sense amplifier 50b may be connected to respective data bus lines.

Figure 5:
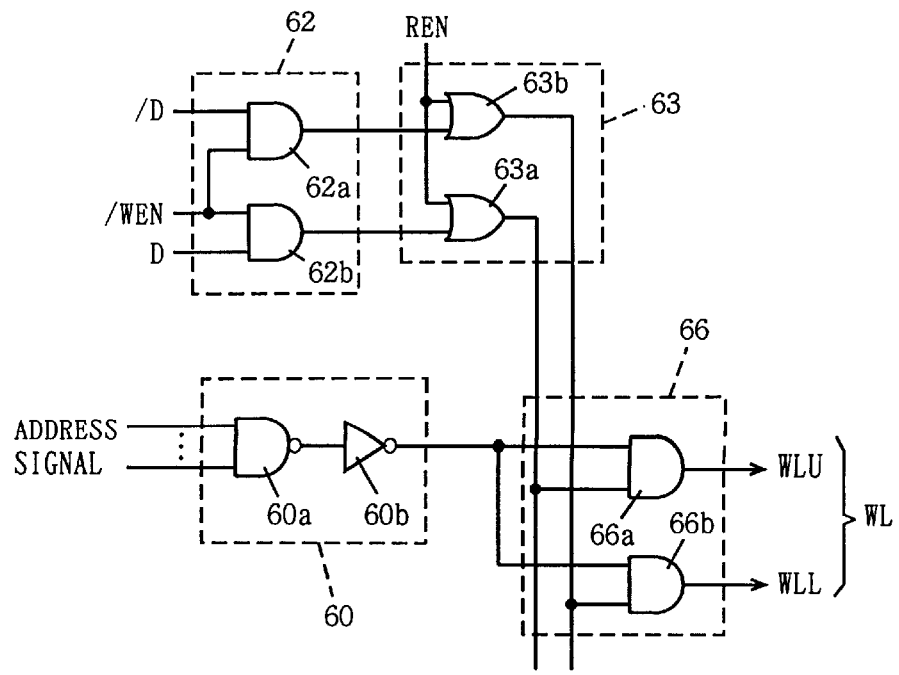
FIG. 5 shows an example of a structure of a word line drive signal generation portion of the semiconductor memory device/shown in FIG. 1.

FIG. 5 schematically shows a structure of a word line selection signal generation portion. In FIG. 5, the word line selection signal generation portion includes a row decoder 60 decoding an externally applied address signal (row address signal), a write word line control circuit 62 generating a word line drive signal in accordance with write data D and negative logic write enable signal /WEN, a read word line control circuit 63 generating a word line drive signal to be transferred to a selected word line in response to a positive logic read enable signal REN and the word line drive signal from write word line control circuit 62, and a word line drive circuit 66 transferring a word line selection signal to the selected word line in response to the word line drive signal from read word line control circuit 63 and a word line designation signal from row decoder 60. Although row decoder 60 and word line drive circuit 66 are provided corresponding to each word line, the structure is representatively shown in FIG. 5 in which the row decoder and the word line drive circuit are provided corresponding to one word line.

Row decoder 60 includes a NAND circuit 60a receiving the address signal and an inverter 60b receiving an output signal from NAND circuit 60a. Inverter 60b outputs a word line designation signal. The H level word line designation signal is output for a word line corresponding to an addressed row.

Write word line control circuit 62 includes an OR circuit 62a receiving write enable signal /WEN and write data /D, and an OR circuit 62b receiving write enable signal /WEN and write data D. Read word line control circuit 63 includes an OR circuit 63a receiving read enable signal REN and an output signal from OR circuit 62b, and an OR circuit 63b receiving an output signal from OR circuit 62a and read enable signal REN.

Write enable signal /WEN is driven to the L level active state for a prescribed period at the time of data writing. Read enable signal REN is driven to the H level active state for a prescribed period at the time of data reading. Therefore, sub-word lines WLL and WLU of a selected word line are both driven to the H level at the time of data reading. On the other hand, at the time of data writing, when write data D is at the H level, sub-word line WLU of a selected word line WL is driven to the H level and sub-word line WLL is kept at the L level. When write data D is at the L level, sub-word line WLL is driven to the H level and sub-word line WLU is kept at the L level. Therefore, the potential levels of sub-word lines WLU and WLL can be set according to the write data at the time of data writing, and the sub-word lines of the selected word line can both be driven to the H level at the time of reading.

Figure 6:
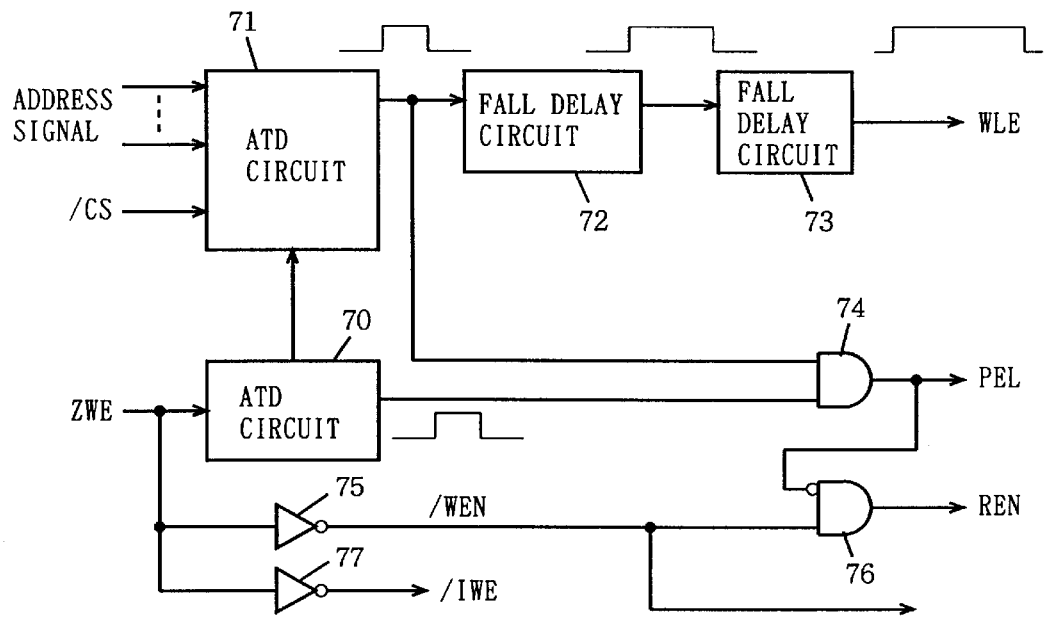
FIG. 6 shows an example of a structure of a control signal generation portion generating each control signal shown in FIG. 1.

FIG. 6 schematically shows a structure of a control signal generation portion generating each control signal shown in FIG. 1. In FIG. 6, the control signal generation portion includes an ATD circuit 70 detecting a transition of externally applied write enable signal ZWE, and an ATD circuit 71 activated upon activation of an externally applied chip select signal /CS, for detecting a transition of the externally applied address signal. ATD circuit 71 combines (takes a logic sum of) a one shot pulse signal from ATD circuit 70 and a one-shot pulse signal generated when an address transition is detected and outputs a transition detection signal.

The control signal generation portion further includes a fall delay circuit 72 delaying only a fall of the pulse signal output from ATD circuit 71 for a prescribed period, and a fall delay circuit 73 further delaying the fall of the pulse signal from fall delay circuit 72. Fall delay circuit 73 outputs word line enable signal WLE having a prescribed time width. Word line enable signal WLE determines an internal active period of word line selection, and each control signal is generated based on word line enable signal WLE.

Fall delay circuits 72 and 73 delay only a fall of a given pulse signal (here, ATD circuit 71 is assumed to output a signal which rises at the H level when an address transition or a transition of the write enable signal is detected). Therefore, word line enable signal WLE is driven to the active state for a prescribe period in response to a rise (activation) of the output signal from ATD circuit 71. The operational period of a decoder or the like is determined according to word line enable signal WLE.

The control signal generation portion further includes an AND circuit 74 receiving output signals from ATD circuits 70 and 71, and inverter 75 receiving external write enable signal ZWE and outputting write enable signal /WEN, a gate circuit 76 receiving write enable signal /WEN output from inverter 75 and bit line precharge instruction signal PEL from AND circuit 74, and an inverter 77 receiving write enable signal ZWE and outputting an internal write control signal /IWE. Gate circuit 76 drives read enable signal REN, which is its output signal, to the H level active state when bit line precharge instruction signal PEL is at the L level inactive state and write enable signal /WEN is at the H level inactive state, indicating data reading. At the time of data reading, therefore, read enable signal REN is activated after the bit line precharge operation is completed.

In FIG. 6, write enable signal /WEN is generated from inverter 75 and applied to write drive circuit 50 shown in FIG. 4 and write control circuit 62 shown in FIG. 5. However, internal write instruction signal /IWE from inverter 77 may be used instead of write enable signal /WEN.

Bit line precharge instruction signal PEL is activated when both output signals from ATD circuits 70 and 71 are at the H level. Therefore, when the address signal and/or write enable signal ZWE make transitions and designate writing or reading, bit line precharge instruction signal PEL is activated to precharge a bit line to a prescribed potential level.

Then, the bit line precharge potential level will be described before the description of a structure of bit line precharge circuit 30.

Figure 7:
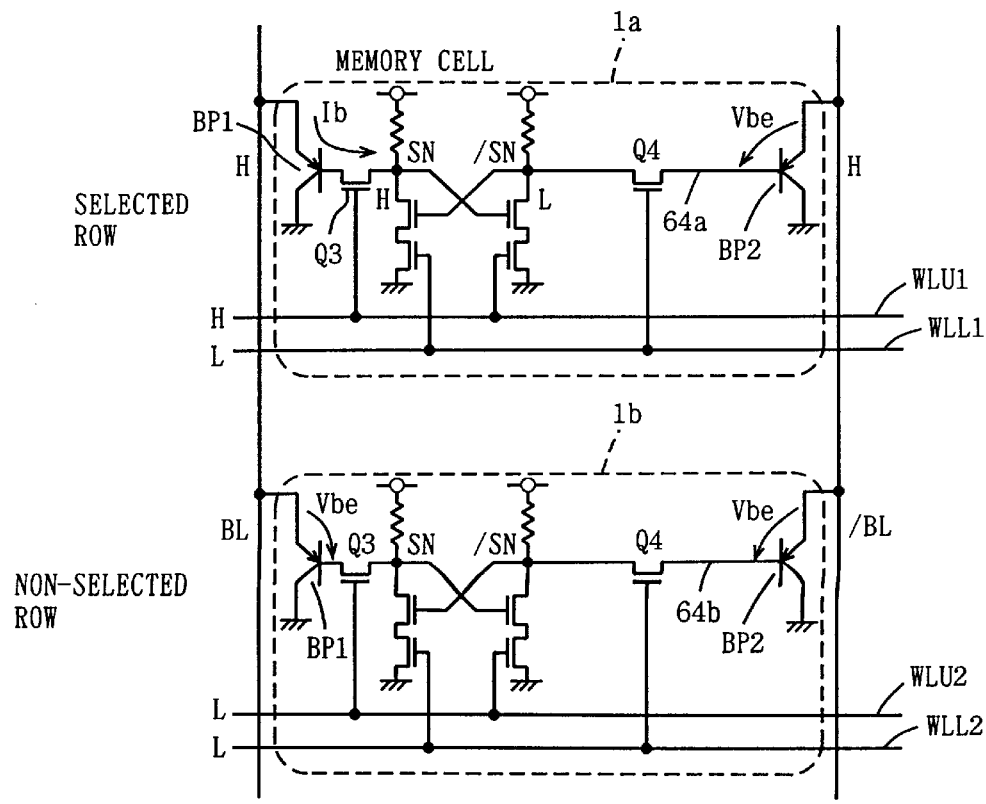
FIG. 7 shows a potential of an internal node of a memory cell of the semiconductor memory device shown in FIG. 1 at the time of data writing.

FIG. 7 shows the internal node potentials of bit lines and sub-word lines as well as a memory cell at the time of data writing. At the time of data writing, bit lines BL and /BL are driven to the power supply voltage Vcc level. It is assumed in FIG. 7 that a memory cell 1a is selected and the signal potentials of sub-word lines WLU1 and WLL1 are at the H and L levels, respectively. In this case, in a memory cell 1b which is arranged in the same column as memory cell 1a and in a non-selected row, sub-word lines WLU2 and WLL2 are both at the L level and access transistors Q3 and Q4 of memory cell 1b are both off. In selected memory cell 1a as well, access transistor Q4 is off.

At the time of data writing, a base current flows through bipolar transistor BP1 of a memory cell 1a, and the potential levels of storage nodes SN and /SN are driven to the H and L levels, respectively. At this time, in the selected memory cell 1a, current flows between the emitter and base of bipolar transistor BP2, and a base electrode node 64a is charged to a voltage level which is lower than that of bit line /BL by emitter-to-base voltage (built-in voltage) Vbe.

In non-selected memory cell 1b as well, access transistors Q3 and Q4 are both off. At the time of data writing, current flows through bipolar transistors BP1 and BP2, and the potential of a base electrode node 64b is raised. The potential difference between bit line /BL and base electrode node 64b becomes Vbe, and the potential difference between the base electrode node of bipolar transistor BP1 and bit line BL in non-selected memory cell 1b is also the Vbe level. In this state, data writing is completed.

FIG. 8 shows the relationship between emitter-to-base voltage Vbe and base current Ib. The axis of ordinates represents base current Ib (unit A) while the axis of abscissas represents emitter-to-base voltage Vbe (unit V). When emitter-to-base voltage Vbe is larger, larger base current Ib flows. Thus, the base electrode node potential is raised. If the potential difference is reduced between a bit line and a base electrode node, a constant small current (not more than 100 pA in FIG. 8) of the leakage current of an emitter-to-base junction is caused as the base current. An emitter-to-base voltage Vbe (H) when a constant small base current (not more than 100 pA) flows and omitter/base junction is almost at an equilibrium state is defined as a "built-in voltage" in the present specification. When the built-in voltage is applied between the emitter and the base, the bipolar transistor is in a border region between the conductive and non-conductive states.

When data writing is completed, bit lines BL and /BL are pulled down to the L level by the bit line precharge circuit. As shown in FIG. 9, before time t0, the potentials of bit lines BL and /BL are at the power supply voltage Vcc level, and the potentials of base electrode nodes 64a and 64b of a bipolar transistor corresponding to L level storage node of the selected memory cell and of a bipolar transistors of the non-selected memory cell, respectively, are at a voltage level lower by built-in voltage Vbe (H) than the potential levels of bit lines BL and /BL.

At time t0, the bit line precharge circuit is activated and the potentials of bit lines BL and /BL are pulled down to the L level. It is assumed here that the ground voltage GND level is the L level. In this case, access transistors Q3 and Q4 are off in non-selected memory cell 1b. Therefore, the potentials of base electrode nodes 64a and 64b are lowered by capacitance coupling of junction capacitance between the emitter and the base, in accordance with a potential drop of bit lines BL and /BL. The potential levels of both electrode nodes 64a and 64b are lower than ground potential GND by emitter-to-base voltage Vbe. Since emitter-to-base voltage Vbe is smaller than built-in voltage Vbe (H) because of the degree of capacitance coupling, for example, it is shown as emitter-to-base voltage Vbe. In this case, the problems arise when the base electrode node comes to have a negative potential, as described below.

Figure 10:
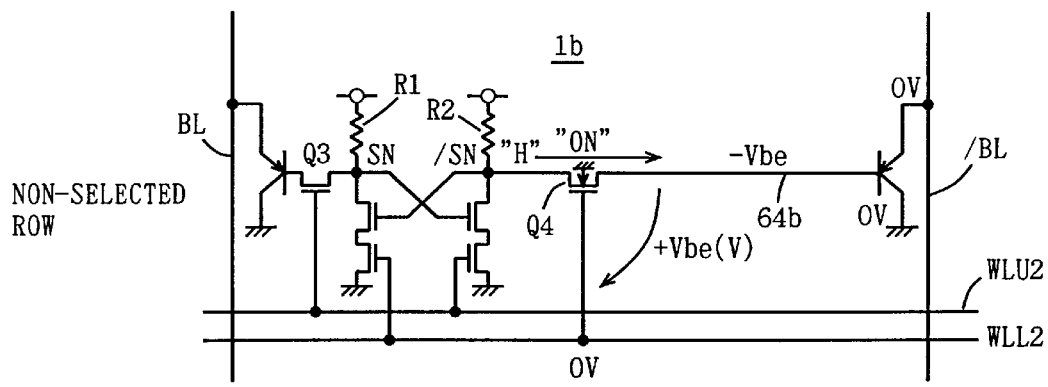
FIG. 10 is a diagram for describing problems which may be caused when the potential of the base electrode node of the bipolar transistor shown in FIG. 9 makes a transition.

FIG. 10 shows the potentials of an internal node and a bit line in a non-selected memory cell when the bit line is precharged to the L level. As shown in FIG. 10, bit line /BL is at the ground voltage GND (0V) level and base electrode node 64b is at the negative voltage level of -Vbe. Sub-word lines WLU2 and WLL2 are both at the potential level of ground voltage GND (0V), and access transistors Q3 and Q4 normally receive the ground voltage level at their back gates. In order to prevent fluctuation in junction capacitance due to variation in manufacturing parameters, a transferred signal potential and so on, the back gate bias voltage is set at a constant voltage level.

It is assumed here that H level data is stored in storage node /SN. When access transistor Q4 has its back gate different in potential from its source and the source potential is negative, access transistor Q4 have the same state as the one in which the back gate bias is made shallower, and the effective threshold voltage of access transistor Q4 is lowered. Therefore, gate-to-source voltage Vbe of access transistor Q4 becomes higher than the effective threshold voltage of access transistor Q4, and thus access transistor Q4 is rendered conductive. High resistance resistive element R2 is only required of the current drivability which compensates for the leakage current of storage node /SN, and the current drivability thereof is extremely low. Therefore, a positive charge held in storage node /SN flows to base electrode node 64b through access transistor Q4, and the H level data held in storage node /SN is changed to the L level data. Thus, the data stored in memory cell 1b is destroyed.

Destruction of memory cell data when a bit line is precharged to the L level is caused at the time of data reading operation as well. At the time of data reading, one of bit lines BL and /BL is driven to the power supply voltage Vcc level (the other bit line is at the voltage level of about Vbe). Therefore, when a bit line is precharged to the L level, the base potential of a bipolar transistor which is connected to this H level bit line through the bipolar transistor in a memory cell is lowered, thus causing the same problem.

Therefore, the L level potential to which the bit line precharge circuit precharges should be set to such a potential level that an access transistor is not rendered conductive. However, since bipolar transistors BP1 and BP2 of a memory cell is rendered conductive and current flows in the collectors of bipolar transistors BP1 and BP2 when the L level potential is made higher, the L level potential cannot be made higher. Therefore, the L level potential to which the bit line precharge circuit precharges has a certain range.

Figure 11:
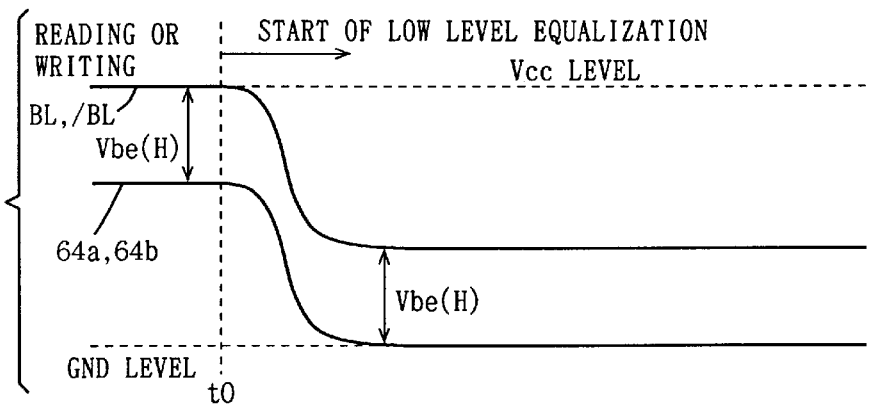
FIG. 11 illustrates the potential transition of the base electrode node of the memory cell bipolar transistor when a bit line precharge potential used according to the present invention is employed.

As shown in FIG. 11, the L level precharge potential of bit lines BL and /BL is set to built-in voltage Vbe (H). Built-in voltage Vbe (H) is equal to the emitter-to-base potential difference of a bipolar transistor in a memory cell when bit lines BL and /BL are charged to the power supply voltage Vcc. Therefore, when the L level precharge potential of a bit line is set to the built-in voltage level and the bit line is precharged at time t0, the potentials of base electrode nodes 64a and 64b are almost at the ground potential GND level even if capacitance coupling between the emitter and base of a bipolar transistor is caused. Thus, it is almost the same as the potential level of a non-selected word line. As a result, it can prevent conduction of access transistors Q3 and Q4 and destruction of memory cell data.

The L level potential to which the bit line is precharged is almost determined by the amount of current supplied from high resistance resistive elements R1 and R2 in a memory cell, the degree of capacitance coupling between a bit line (emitter node) and a base electrode node, and the relation of the threshold voltages of access transistors Q3 and Q4 when a back gate bias effect is caused. In order to prevent destruction of memory cell data, the bit line precharge potential is set to such a potential level that sets the lowest reachable potential of the base electrode node to a potential level which can ensure that the amount of current supplied from a high resistance resistive element is greater than the amount of current supplied through an access transistor to the base electrode node.

Although a specific L level precharge potential level varies according to the condition above, it can be set in the range of values described below. As shown in FIG. 8, the value of emitter-to-base voltage Vbe of a PNP bipolar transistor changes exponentially according to the characteristic of the PNP bipolar transistor and the condition of the bit line bias current. Under the condition which is actually used, the value of emitter-to-base voltage Vbe is approximately 0.5 V–1.0 V. When the bipolar transistor is active and a large current flows between the base and emitter, emitter-to-base voltage Vbe is large. On the contrary, when a small current is caused between the emitter and base, or base current Ib is small, emitter-to-base voltage Vbe is small.

When a bit line is charged and the bit line potential is raised, a large voltage is applied between the emitter and the base and then current is supplied to the base electrode node of a bipolar transistor. Accordingly, the potential of the base electrode node is raised. As the potential of the base electrode node rises, emitter-to-base potential reduces time-dependently. Accordingly, the amount of current flowing from the emitter to the base is reduced and therefore voltage applied between the base and the emitter is small. For this voltage, that is, the built-in voltage, flowing base current Ib is not more than 100 pA. When the bit line potential is lowered to the L level in this case, emitter-to-base capacitance coupling causes the potential of the base electrode node to be lowered while emitter-to-base potential difference Vbe (H) is sustained. In order to prevent leakage of data holding current through access transistors Q3 and Q4, the potential of the base electrode node is set to the ground potential GND (0V) level. In other words, the L level precharge potential of a bit line is set to the potential of built-in voltage Vbe (H). Thus, L level precharge potential Vp1 satisfies the following expression.

$$0 < Vp1 \leq Vbe\ (H)$$

Figure 12:
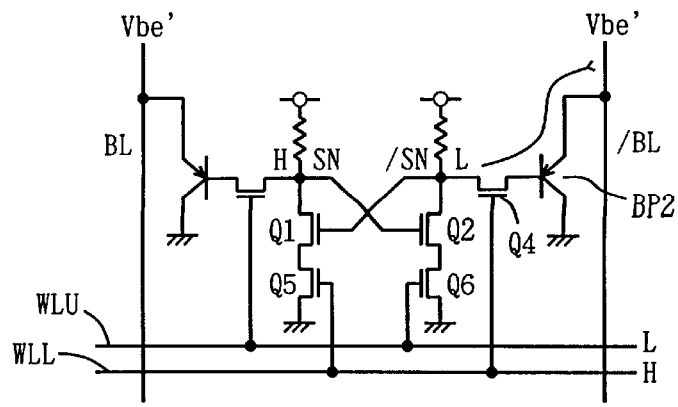
FIG. 12 is a diagram for describing the effects of the bit line precharge potential on non-selected memory cells at the time of data writing.

The case is considered in which the L level precharge potentials of bit lines BL and /BL are higher than built-in voltage Vbe (H). FIG. 12 shows the voltages applied to a memory cell in a selected row and in a non-selected column. In FIG. 12, the state is shown in which the potential of sub-word line WLU is at the L level and the potential of sub-word line WLL is the H level. L level data is written to a selected memory cell. It is assumed here that storage node SN stores H level data and storage node /SN stores L level data. Non-selected bit lines BL and /BL hold the L level precharge potential.

When the L level precharge potential is higher than built-in voltage Vbe (H), access transistor Q4 connected to storage node /SN is rendered conductive to transfer the base current of bipolar transistor BP2 to storage node /SN. The potential of sub-word line WLU is at the L level and cut transistor Q6 is off. Therefore, the potential of storage node /SN is raised, and driver transistor Q1 is rendered conductive to discharge storage node SN. As a result, the potential of storage node SN is lowered while the potential of storage node /SN is raised. Data stored in storage node SN and /SN is inverted and data stored in the non-selected memory cell is destroyed. In order to prevent such a state, it is necessary to set the L level precharge potential of a bit line to a level at which a bipolar transistor is not rendered conductive. Thus, the L level precharge potential is selected to be a certain potential not more than built-in voltage Vbe (H) and higher than ground potential GND (0V).

Consequently, a static type semiconductor memory device can be provided which can prevent destruction of memory cell data when a bit line is precharged to the L level and which can stably hold data and operate at high speed even under a low power supply voltage. The specific structures of the bit line precharge circuit will be described below.

First Embodiment of Bit Line Precharge Circuit

Figure 13:
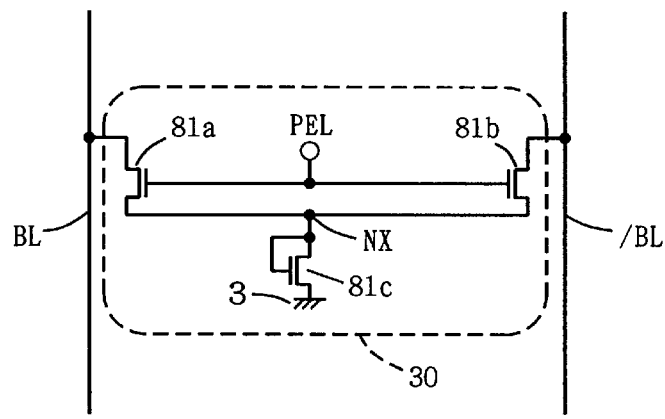
FIGS. 13 to 20 show structures of first to eighth embodiments of the bit line precharge circuit according to the present invention, respectively.

FIG. 13 shows a structure of a first embodiment of the bit line precharge circuit according to the present invention. In FIG. 13, bit line precharge circuit 30 includes an n channel MOS transistor 81a connected between bit line BL and a common node NX and receiving bit line precharge instruction signal PEL at its gate, an n channel MOS transistor 81b connected between bit line /BL and common node NX and receiving bit line precharge instruction signal PEL at its gate, and an n channel MOS transistor 81c connected between common node NX and ground node 3 and having its gate connected to common node NX.

N channel MOS transistor 81c has its gate and drain interconnected and operates in a diode mode to cause a voltage drop of threshold voltage Vth when rendered conductive. Therefore, the potential of common node NX is Vth+GND=Vth.

N channel MOS transistors 81a and 81b operate as switching transistors, and are turned on when bit line precharge instruction signal PEL is at the H level, and connect common node NX to respective bit lines BL and /BL. Therefore, bit lines BL and /BL are precharged to the potential of the threshold voltage Vth level of n channel MOs transistor 81c. Threshold voltage Vth of n channel MOS transistor 81c is set to satisfy the following expression.

$$GND\ (0V) < Vth < Vbe\ (H).$$

In the expression, Vbe (H) represents the built-in voltage of the emitter-to-base junction of a bipolar transistor in a memory cell. Bit line precharge circuit 30 shown in FIG. 13 is provided for each bit line pair. Thus, the L level of each bit line is the potential level between the built-in voltage and the ground voltage, and thus destruction of memory cell data when a bit line is precharged to the L level can be prevented. The threshold voltage of n channel MOS transistor 81c can easily be adjusted by ion implantation into a channel region.

By the use of a diode-connected n channel MOS transistors for setting the L level of the bit line precharge circuit, a desired L level precharge voltage can easily be produced. Further, by a MOS transistor, a necessary precharge potential can be produced and the level shift of the L level of bit line precharge potential from the ground voltage can be realized in a small occupied area.

Second Embodiment of Bit Line Precharge Circuit

Figure 14:
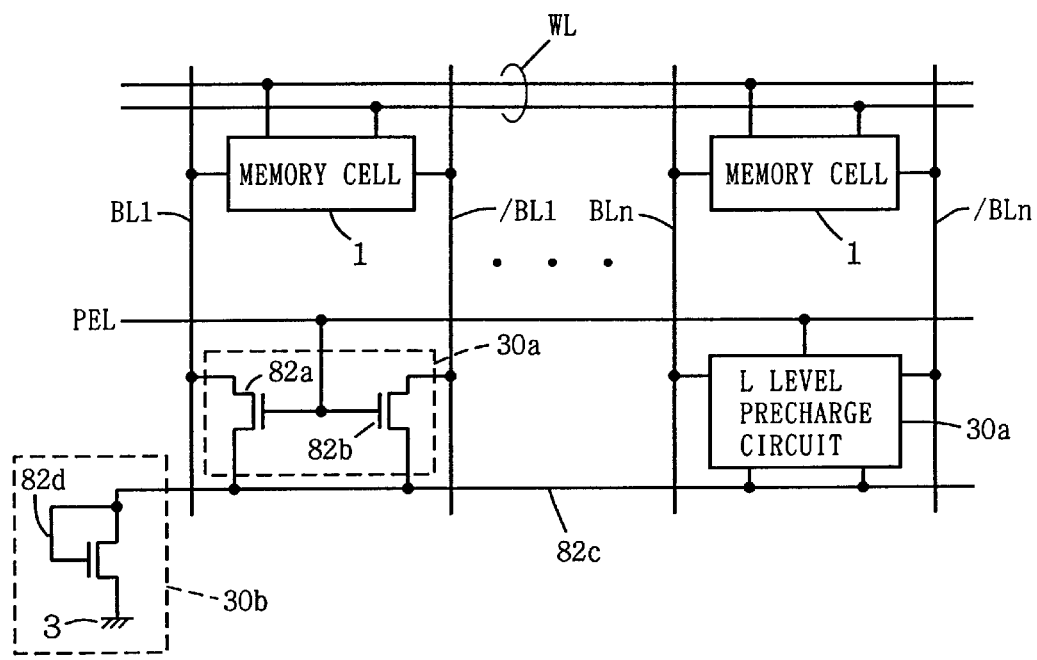

FIG. 14 shows a structure of a second embodiment of the bit line precharge circuit according to the present invention. In FIG. 14, an L level precharge circuit 30a is provided for each of bit line pairs BL1, BL1–BL$n$, /BL$n$, and is activated upon activation of bit line precharge instruction signal PEL, for precharging a corresponding one of bit line pairs BL1, BL1–BL$n$, /BL$n$ to the L level. Memory cell 1 is arranged at a crossing of bit line pairs BL1, /BL1–BL$n$, /BL$n$ and word line WL. Memory cell 1 has the same structure as the memory cell shown in FIG. 1.

L level precharge circuit 30a provided for each bit line pair transfers the L level potential which is transferred to an L level precharge potential transfer line 82c to each bit line of a corresponding bit line pair when bit line precharge instruction signal PEL is activated. An L level precharge potential from an L level precharge potential generation circuit 30b is transferred to L level precharge potential transfer line 82c.

L level precharge circuit 30a has the same structure for each bit line pair. In FIG. 14, L level precharge circuit 30a provided for bit line pair BL1 and /BL1 are specifically shown. L level precharge circuit 30a includes an n channel MOS transistor 82a rendered conductive (turned on) upon activation of bit line precharge instruction signal PEL, for electrically connecting bit line BL1 to L level precharge potential transfer line 82c, and an n channel MOS transistor 82b rendered conductive (turned on) upon activation of bit line precharge instruction signal PEL, for electrically connecting bit line /BL1 to L level precharge potential transfer line 82c. These MOS transistors 82a and 82b operate as switching transistors and transfer, when rendered conductive, the precharge potential of L level precharge potential transfer line 82c to corresponding bit lines.

L level precharge potential generation circuit 30b includes an n channel MOS transistor 82d connected between L level precharge potential transfer line 82c and ground node 3 and having its gate connected to L level precharge potential transfer line 82c. This MOS transistor 82d operates in a diode mode, and causes a voltage drop of threshold voltage Vth when rendered conductive. Therefore, the potential of L level precharge potential transfer line 82c is a potential level which is higher than ground voltage GND of ground node 3 by threshold voltage Vth.

L level precharge circuit 30a and L level precharge potential generation circuit 30b constitute a bit line precharge circuit. In the structure shown in FIG. 14, L level precharge potential generation circuit 30b is sharedly provided for respective bit line pairs. Therefore, the area occupied by the bit line precharge circuit can be reduced. Threshold voltage Vth of MOS transistor 82d included in bit line precharge potential generation circuit 30b also satisfies the following expression.

$$GND\ (0V) < Vth < Vbe\ (H).$$

Third Embodiment of Bit Line Precharge Circuit

Figure 15:
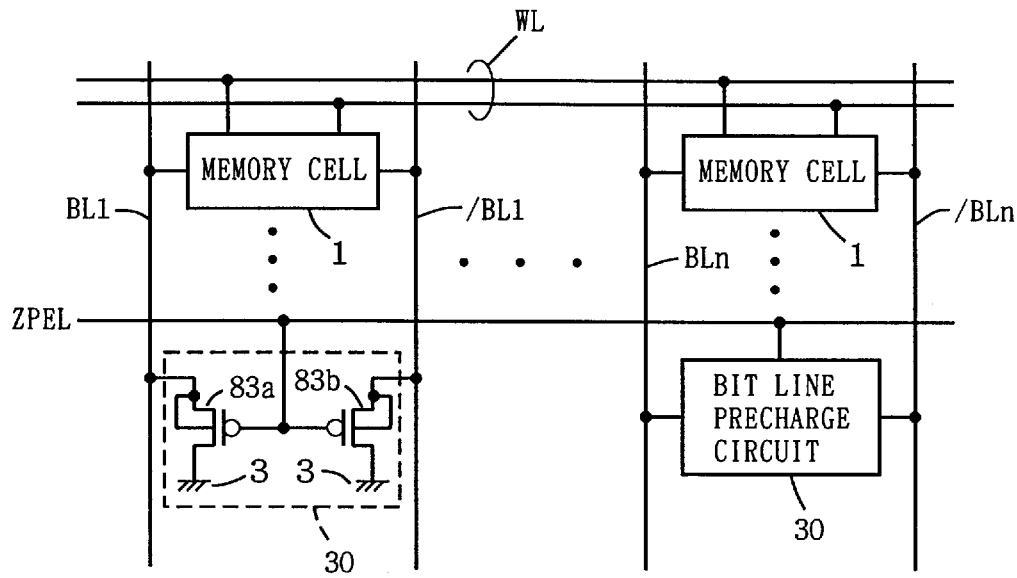

FIG. 15 shows a structure of a third embodiment of the bit line precharge circuit according to the present invention. In FIG. 15, bit line precharge circuit 30 is provided for each one of bit line pairs BL1, BL1–BL$n$, /BL$n$. Memory cell 1 is arranged corresponding to a crossing of word line WL (sub-word line pair) and each of bit line pairs BL1, BL1–BL$n$, /BL$n$. In the following description of the bit line precharge circuit, memory cell 1 is arranged corresponding to a crossing of each bit line pair and a word line (sub-word line pair). Therefore, this description will not be repeated.

Bit line precharge circuit 30 has the same structure for each one of bit line pairs BL1, BL1–BL$n$, /BL$n$. FIG. 15 shows a structure of the bit line precharge circuit provided for bit line pair BL1, /BL1.

Bit line precharge circuit 30 includes a p channel MOS transistor 83a connected between corresponding bit line BL (BL1–BL$n$) and ground node 3 and receiving a bit line precharge instruction signal ZPEL at its gate, and a p channel MOS transistor 83b connected between corresponding bit line /BL (/BL1–/BL$n$) and ground node 3 and receiving bit line precharge instruction signal ZPEL at its gate. P channel MOS transistors 83a and 83b have their back gates (substrate regions) connected to respective source nodes (nodes connected to bit lines).

Bit line precharge instruction signal ZPEL is driven to the ground voltage GND level when activated. Therefore, p channel MOS transistors 83a and 83b are rendered conductive when corresponding bit lines BL, /BL are precharged to the L level and the gate-to-source voltages thereof become the threshold voltage Vthp. Therefore, bit lines BL1, BL1–BLn, /BLn are precharged to a voltage level which is higher than ground voltage GND by an absolute value |Vthp| of the threshold voltage of p channel MOS transistors 83a and 83b.

The back gates of p channel MOS transistors 83a and 83b are connected to the respective source nodes to prevent the back gate effect. The case in which the back gates of p channel MOS transistors 83a and 83b are biased to the power supply voltage Vcc level will be considered. When a bit line is discharged to the L level, the source potential and the back gate potential are not equal in p channel MOS transistors 83a and 83b, thus causing the back gate effect. In this state, the back gate bias becomes deeper and the absolute value |Vthp| of the threshold voltage of p channel MOS transistors 83a and 83b becomes larger. This back gate effect becomes stronger as the voltage level of power supply voltage Vcc is raised.

On the other hand, the built-in voltage of a bipolar transistor included in memory cell 1 is an almost constant voltage which does not depend on the voltage level of power supply voltage Vcc. Therefore, when the threshold voltage of MOS transistors 83a and 83b changes according to the operational power supply voltage, the L level precharge potential becomes higher than the built-in voltage of a bipolar transistor in memory cell 1 and current flows through the bipolar transistor in memory cell 1. In order to prevent the dependency of the L level precharge potential on the power supply voltage, the back gate and source of each of p channel MOS transistors 83a and 83b are interconnected in bit line precharge circuit 30 so as to prevent the back gate effect. Thus, the threshold voltage of MOS transistors 83a and 83b can be set at a constant voltage level which does not depend on the power supply voltage.

In the structure shown in FIG. 15 as well, when the threshold voltage of MOS transistors 83a and 83b is Vthp, the threshold voltage satisfies the following expression.

$$GND\ (0V) < |Vthp| < Vbe\ (H).$$

As in the structure shown in FIG. 15, a necessary precharge potential can stably be produced by using a p channel MOS transistor having its back gates and source interconnected so as to produce the L level precharge potential.

Fourth Embodiment of Bit Line Precharge Circuit

Figure 16:
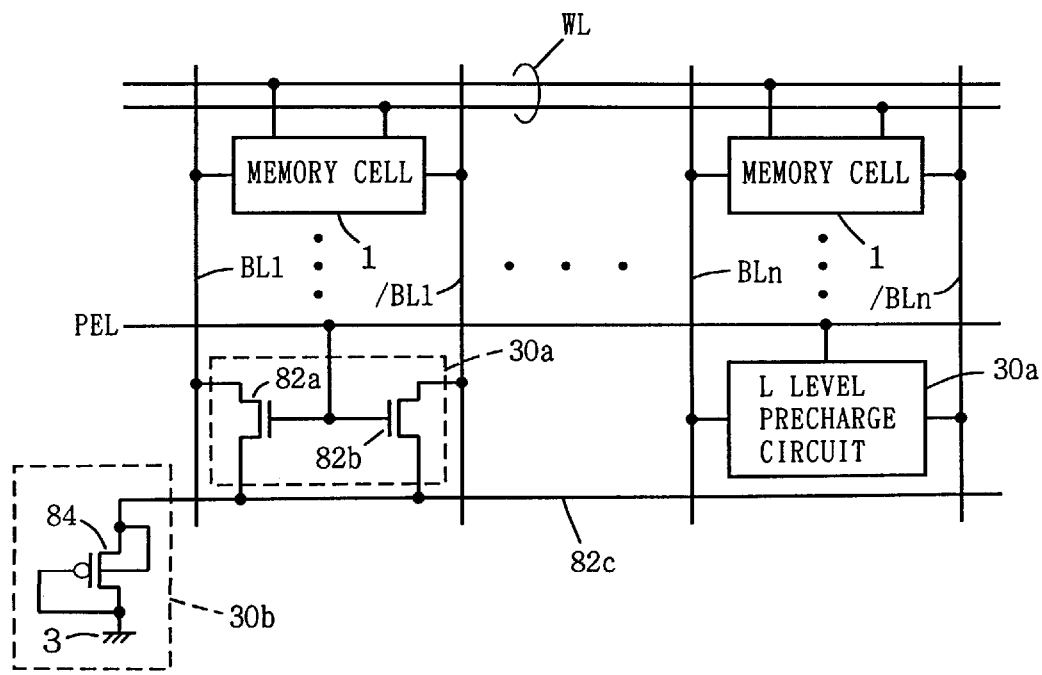

FIG. 16 shows a structure of a fourth embodiment of the bit line precharge circuit according to the present invention. The structure of the bit line precharge circuit shown in FIG. 16 differs from the structure of the bit line precharge circuit shown in FIG. 4 in that L level precharge potential generation circuit 30b includes a p channel MOS transistor 84 having its gate and drain connected to ground node 3 and its back gate and source connected to L level precharge potential transfer line 82c. Even if p channel MOS transistor 84 is used as means for generating the L level precharge potential, the potential of L level precharge potential transfer line 82c is |Vthp|. Here, Vthp indicates the threshold voltage of p channel MOS transistor 84. Therefore, in the structure shown in FIG. 16 as well, bit lines BL1, BL1–BLn, /BLn are precharged to the voltage level of |Vthp| at the time of standby. Threshold voltage Vthp of MOS transistor 84 satisfies the relation represented by the following expression.

$$GND\ (0V)\ V|Vthp| < Vbe\ (H).$$

Even if this p channel MOS transistor is used, the back gate effect can be prevented by connecting the back gate and the source, and the L level bit line precharge potential of a desired voltage level can stably be produced.

Fifth Embodiment of Bit Line Precharge Circuit

Figure 17:
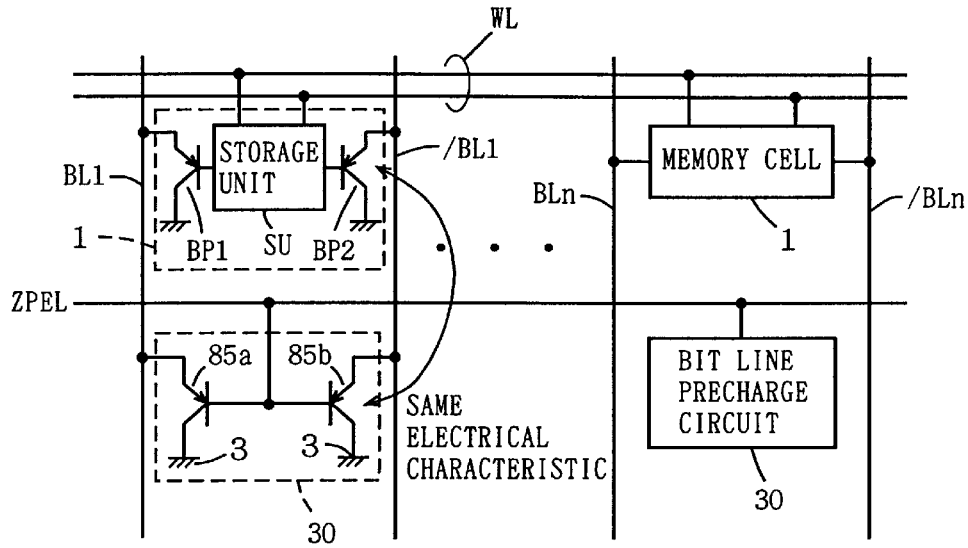

FIG. 17 shows a structure of a fifth embodiment of the bit line precharge circuit according to the present invention. In FIG. 17, bit line precharge circuit 30 is provided for each one of bit line pairs BL1, BL1–BLn, /BLn. FIG. 17 specifically shows a structure of bit line precharge circuit 30 provided for bit line pair BL1, /BL1. Bit line precharge circuit 30 includes a pnp bipolar transistor 85a having its emitter connected to bit line BL (BL1–BLn) and its collector connected to ground node 3 and receiving bit line precharge instruction signal ZPEL at its base electrode node, and a pnp bipolar transistor 85b having its emitter connected to bit line /BL (BL1–BLn) and its collector connected to ground node 3 and receiving bit line precharge instruction signal ZPEL at its base electrode node.

Bipolar transistors 85a and 85b have the same electrical characteristic as that of pnp bipolar transistors BP1 and BP2 included in memory cell 1. In other words, they have the same built-in voltage. In FIG. 17, a storage unit SU of memory cell 1 includes an access transistor, a driver transistor and a cut off transistor.

When bit line precharge instruction signal ZPEL is driven to the L level active state, bipolar transistors 85a and 85b are rendered conductive in bit line precharge circuit 30, and bit lines BL1, /BL1–BLn, /BLn are discharged to the L level. When the potentials of bit lines BL1, /BL1–BL2, /BLn come to have the built-in voltage level of bipolar transistors 85a and 85b, discharge current in bit line precharge current 30 becomes extremely small. Thus, discharge of bit lines BL1, /BL1–BLn, /BLn is almost stopped, and bit lines BL1, BL1–BLn, /BLn are kept at the built-in voltage level of bipolar transistors 85a and 85b.

Bipolar transistors 85a and 85b have the same electrical characteristic as that of bipolar transistors BP1 and BP2 included in memory cell 1, and therefore they have the same built-in voltage, and bit lines BL1, /BL1–BLn, /BLn are precharged to the voltage level of the built-in voltage Vbe (H).

By using a bipolar transistor having the same electrical characteristic as that of a bipolar transistor included in memory cell 1 in bit line precharge circuit 30, a circuit for generating a necessary L level precharge potential can be produced without an additional manufacturing process. Further, the precharge potential can exactly be set to the built-in voltage level of the bipolar transistor in memory cell 1, and destruction of memory cell data can reliably be prevented.

Sixth Embodiment of Bit Line Precharge Circuit

Figure 18:
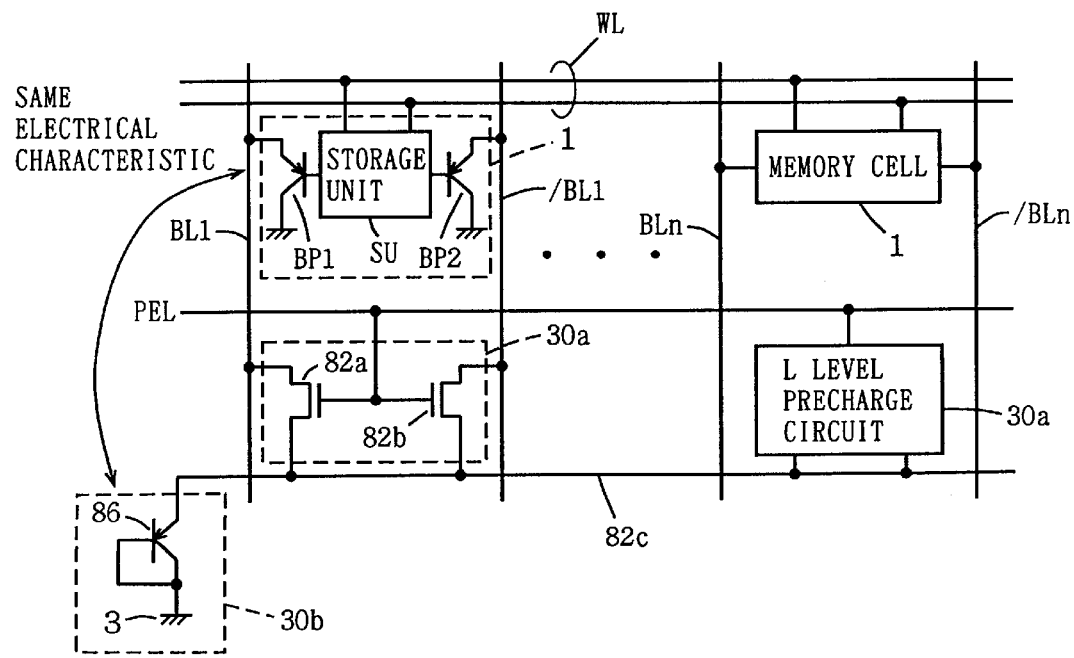

FIG. 18 shows a structure of a sixth embodiment of the bit line precharge circuit according to the present invention. The structure of the bit line precharge circuit shown in FIG. 18 differs from the structure shown in FIG. 16 in the following point. A circuit 30b for generating the L level precharge potential is formed of a pnp bipolar transistor 86 and is provided in common to bit line pairs. This pnp bipolar transistor 86 has its emitter connected to the L level precharge potential transfer line 82c and its base electrode node and collector connected to ground node 3. Pnp bipolar transistor 86 has the same electrical characteristic as that of bipolar transistors BP1 and BP2 included in memory cell 1, and has the same built-in voltage. However, L level precharge potential generation circuit 30b has to discharge the current of bit line pairs BL1, BL1–BL$n$, /BL$n$, and the current drivability of bipolar transistor 86 is set sufficiently higher than that of bipolar transistors BP1 and BP2 of memory cell 1.

L level precharge potential transfer line 82c is kept at the level of the built-in voltage Vbe of bipolar transistor 86. Therefore, when bit line precharge instruction signal PEL is activated, bit lines BL1, /BL1–BL$n$, /BL$n$ are precharged to the level of the built-in voltage of bipolar transistor 86 through L level precharge circuit 30a. The built-in voltage of bipolar transistor 86 is of the same magnitude as that of bipolar transistors BP1 and BP2 in memory cell 1. Therefore, bit lines BL1, /BL1–BL$n$, BL$n$ are precharged to the potential Vbe (H) level.

By utilizing a pnp bipolar transistor as an L level precharge potential generation circuit as shown in FIG. 18, and providing it sharedly for respective bit line pairs, the area occupied by the bit line precharge circuit can be reduced. Further, by making a bipolar transistor for generating the L level precharge potential to have the same electrical characteristic and therefore the same built-in voltage as that of a bipolar transistor in the memory cell, a necessary precharge potential can easily be produced without utilizing an additional manufacturing process or a complicated circuit structure.

Seventh Embodiment of Bit Line Precharge Circuit

Figure 19:
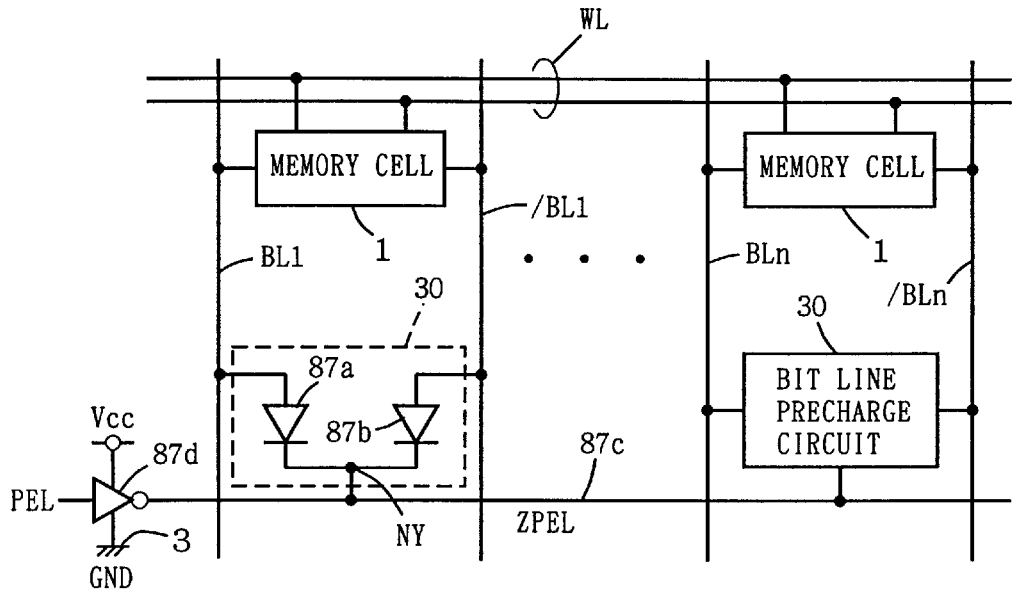

FIG. 19 shows a structure of a seventh embodiment of the bit line precharge circuit according to the present invention. In the structure shown in FIG. 19, bit line precharge circuit 30 is provided for each one of bit line pairs BL1, BL1–BL$n$, /BL$n$. These bit line precharge circuits 30 have the same circuit structure. FIG. 19 shows the structure of bit line precharge circuit 30 provided for bit line pairs BL1, /BL1.

In FIG. 19, bit line precharge circuit 30 includes a PN junction diode 87a forwardly connected between corresponding bit line BL (BL1–BL$n$) and common node NY, and a PN junction diode 87e forwardly connected between corresponding bit line /BL (/BL1–/BL$n$) and common node NY. Common nodes NY are each connected commonly to bit line precharge instruction signal transfer line 87c. To bit line precharge instruction signal transfer line 87c, bit line precharge instruction signal ZPEL is transferred through an inverter 87d. Inverter 87d operates using power supply voltage Vcc and ground voltage GND of ground node 3 as operational power supply voltages.

Bit line precharge instruction signal ZPEL on bit line precharge instruction signal transfer line 87c is driven to the L level when activated, and diodes 87a and 87b of bit line precharge circuit 30 are rendered conductive to precharge bit lines BL1, BL1–BL$n$, /BL$n$ to the voltage level of Vf+GND. Here, Vf is a forward voltage drop of diodes 87a and 87b. The discharge current of bit lines BL1, BL1–BL$n$, /BL$n$ is discharged through inverter 87a to ground node 3. Forward voltage drop Vf of diodes 87a and 87b satisfies the relation represented by the following expression.

$$GND\ (0V) < Vf \leq Vbe\ (H)$$

Therefore, by this forward voltage drop, the base electrode node of the bipolar transistor in memory cell 1 can be prevented from lowering in potential to ground voltage GND (0V) or below, and destruction of memory cell data at the time of precharging can be prevented.

By forming diodes 87a and 87b in the same manufacturing process as the one for forming the emitter and base of a bipolar transistor included in the memory cell, a diode element having forward voltage drop Vf of the same magnitude as built-in voltage Vbe (H) of the bipolar transistor can easily be achieved.

As described above, according to the structure shown in FIG. 19, the bit line precharge circuit is formed of a diode element, so that a necessary L level precharge potential can easily be produced in a simple circuit structure.

Eighth Embodiment of Bit Line Precharge Circuit

Figure 20:
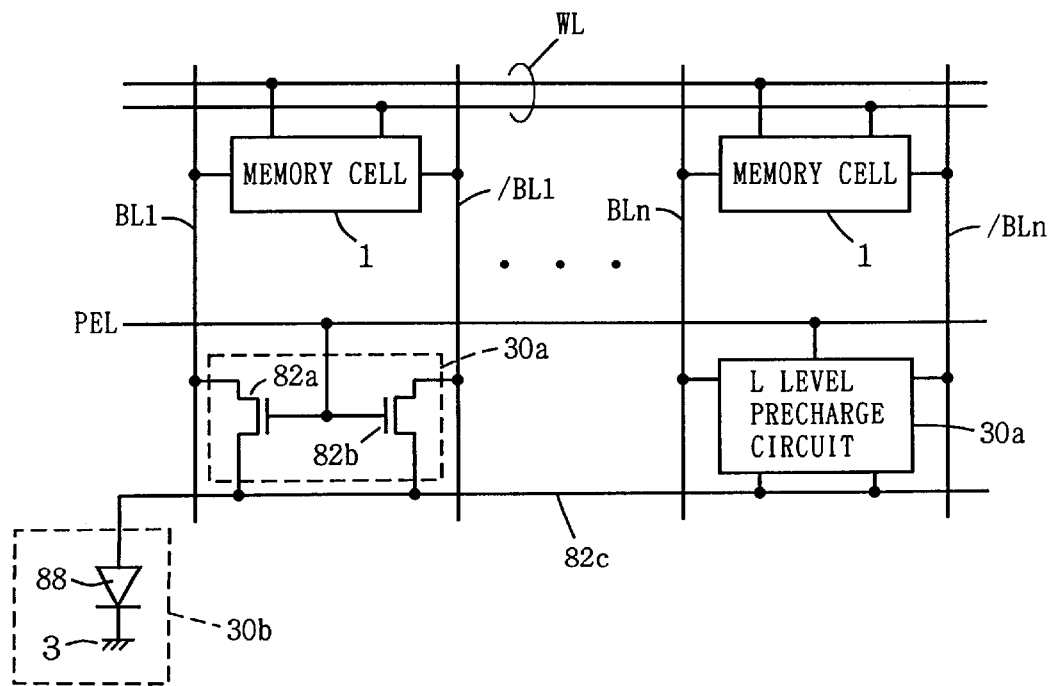
Figure 21:
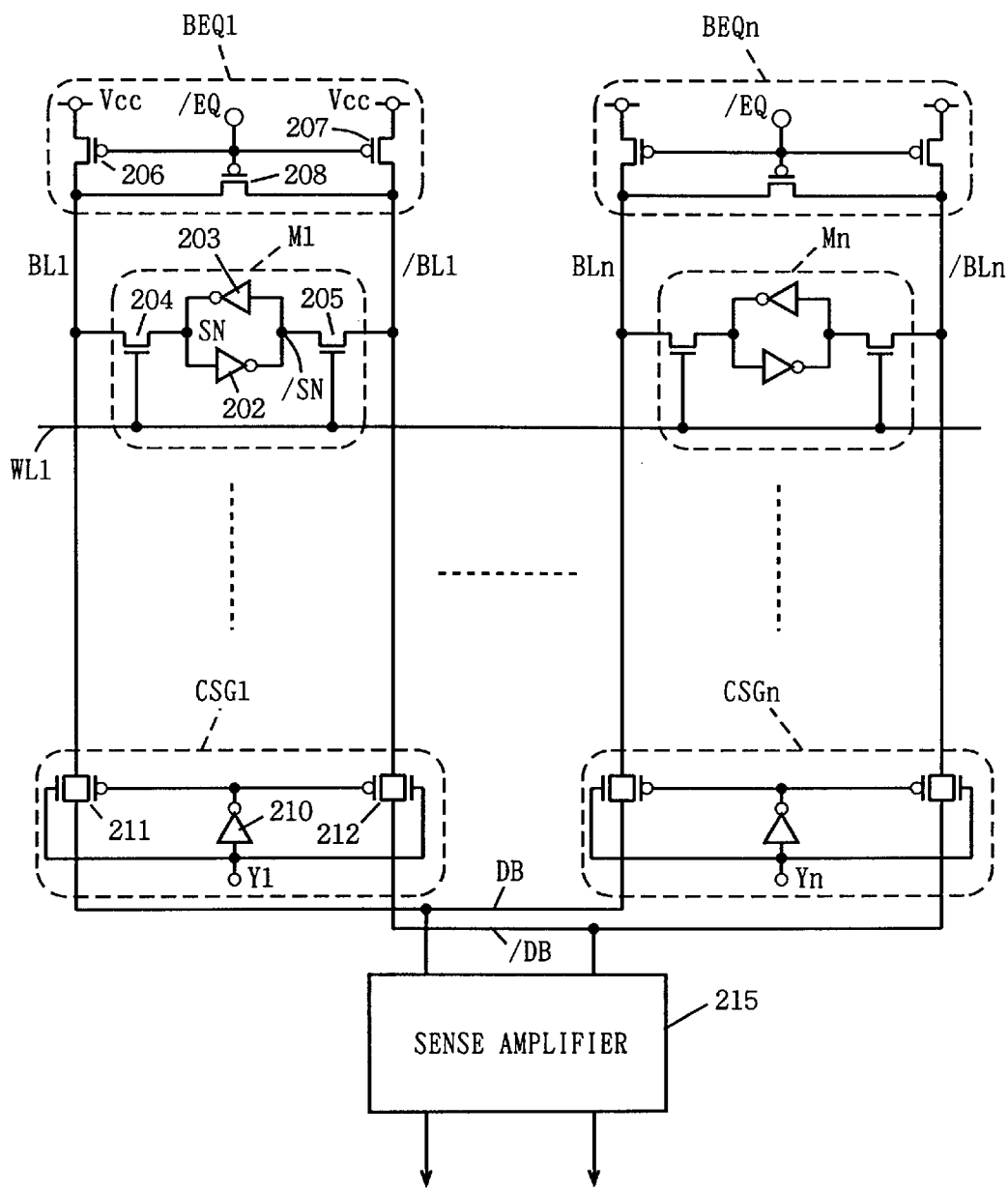
FIG. 21 schematically shows a structure of a main part of a conventional semiconductor memory device.
Figure 22:
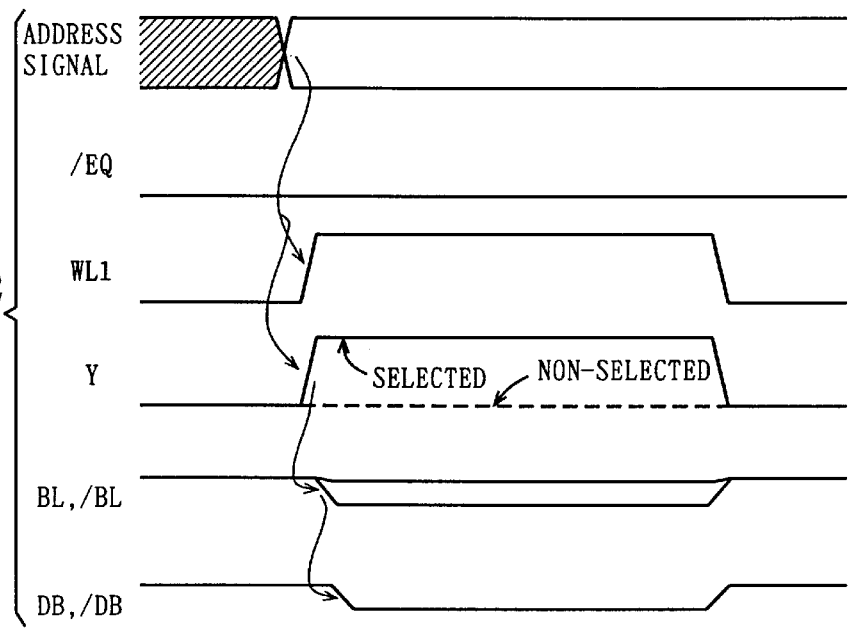
FIG. 22 is a signal waveform diagram illustrating the operation of the semiconductor memory device shown in FIG. 21 at the time of data reading.
Figure 23:
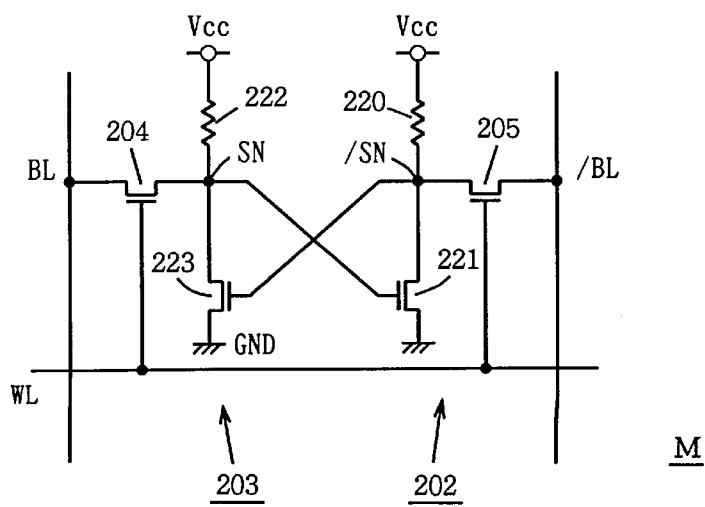
FIG. 23 is a more specific structure of a memory cell shown in FIG. 21.
Figure 24A:
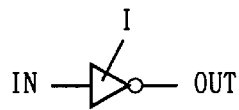
FIG. 24A shows an inverter.
Figure 24B:
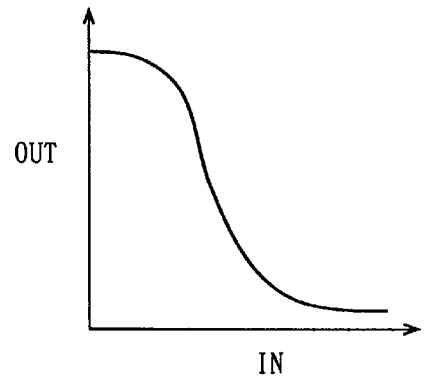
FIG. 24B illustrates the input/output transfer characteristic of the inverter shown in FIG. 24A.
Figure 25A:
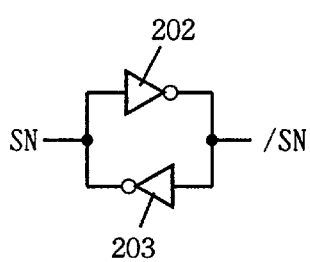
FIG. 25A shows an inverter latch of a memory cell.
Figure 25B:
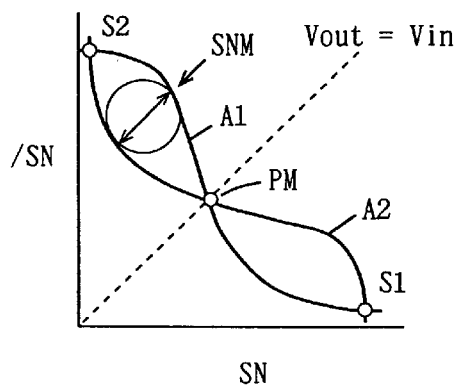
FIG. 25B illustrates the input/output transfer characteristic and the data hold characteristic of the inverter latch shown in FIG. 25A.
Figure 26A:
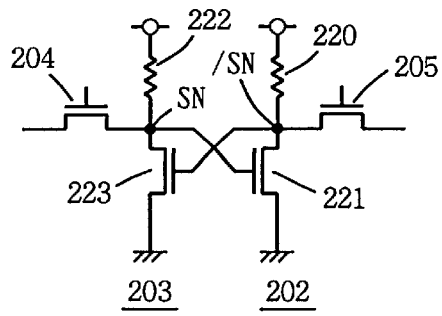
FIG. 26A shows connection in a memory cell in a standby state.
Figure 26B:
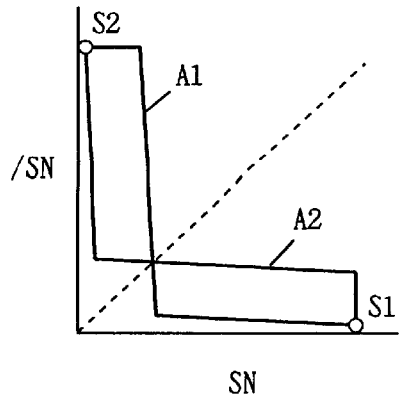
FIG. 26B illustrates the input/output transfer characteristic of an inverter latch when the memory cell shown in FIG. 26A is at the standby state.
Figure 27A:
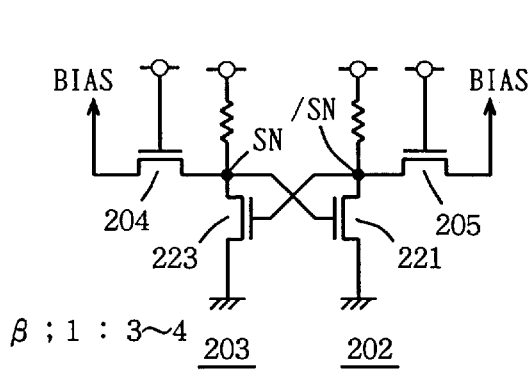
FIG. 27A shows connection of an inverter latch when a memory cell is selected.
Figure 27B:
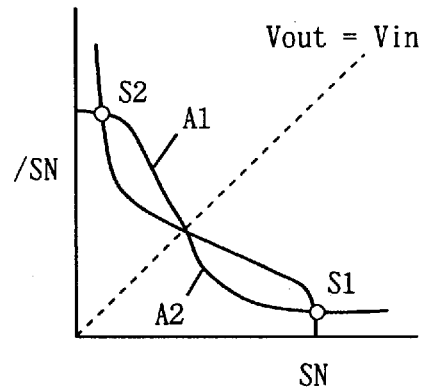
FIG. 27B illustrates the input/output transfer characteristic of an inverter latch.
Figure 27C:
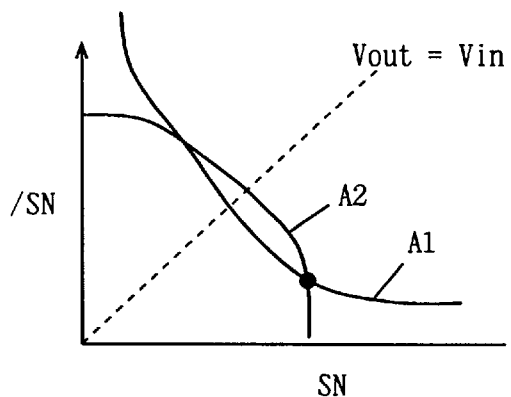
FIG. 27C illustrates a situation when the input/output transfer characteristic is degraded.
Figure 27D:
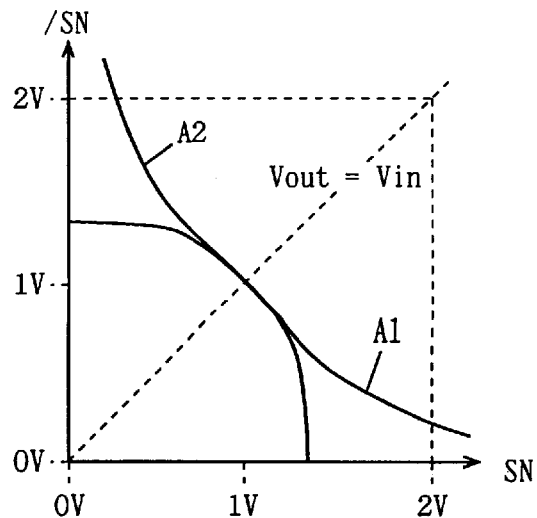
FIG. 27D illustrates the input/output transfer characteristic of the inverter latch under a low power supply voltage when a memory cell is selected.

FIG. 20 shows a structure of an eighth embodiment of the bit line precharge circuit according to the present invention. The structure shown in FIG. 20 differs from the structure shown in FIGS. 14 and 16 in the point that L level precharge potential generation circuit 30b for precharging a bit line is formed of a PN junction diode 88.

Diode 88 has its anode connected to L level precharge potential transfer line 82c and its cathode connected to ground node 3. Therefore, in the structure shown in FIG. 20, the voltage of GND+Vf is transferred to L level precharge potential transfer line 82c by forward voltage drop Vf of diode 88.

When bit line precharge instruction signal PEL is driven to the H level active state, bit lines BL1, /BL1–BL$n$, BL$n$ are electrically connected to L level precharge potential transfer line 82c through L level precharge circuit 30a, and precharged to the voltage level of forward voltage drop Vf. In the structure shown in FIG. 20 as well, forward voltage drop Vf (88) of diode element 88 satisfies the following relation.

$$GND\ (0V) < Vf\ (88) \leq Vbe\ (H)$$

In the structure shown in FIG. 20 as well, a diode element having a necessary forward voltage drop can easily be produced by producing diode element 88 in the same process as the one for forming the emitter and base of a bipolar transistor included in memory cell 1.

Other Applications

The description above is made on an SRAM. However, a semiconductor memory device according to the present invention is not limited to the SRAM, and needs not have to operate statistically and can operate dynamically such that a bit line pair is once precharged to a prescribed potential level (L level), or in response to an equalize instruction signal, all signal lines are precharged to a prescribed potential (this operation is called the dynamic operation).

The SRAM embodying the present invention can utilize any structure for the data write/read path as far as the structure satisfies the condition that both the bit lines of the selected bit line pair are driven to H level in data writing mode while the selected bit lines are driven to H level in data reading mode.

As described above, according to the present invention, the precharge potential of a bit line is adapted to be not less than 0 V and not more than the absolute value of a built-in voltage of a bipolar transistor in a semiconductor memory device having data written/read by utilizing the base current of a bipolar transistor included in a memory cell. Therefore, even if the potential of the base electrode node of the bipolar transistor is changed, destruction of data stored in a memory cell can be prevented when a bit line is precharged. Accordingly, a semiconductor memory device which stably operates and reliably holds data even under a low power supply voltage can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a pair of bit lines;

a word line arranged crossing said pair of bit lines;

a memory cell arranged corresponding to a crossing of said pair of bit lines and said word line;

said memory cell including,
  (i) a cross-coupled type flipflop including cross-coupled insulated gate type field effect transistors for storing complementary data in a pair of storage nodes,
  (ii) a pair of bipolar transistors provided corresponding to said pair of bit lines and each having one conduction node connected to a corresponding bit line, another conduction node connected to a first voltage source supplying a first power supply voltage, and a base electrode node, and
  (iii) a pair of access transistors provided corresponding to said pair of storage nodes and said pair of bipolar transistors, selectively rendered conductive in response to a signal potential of said word line, for electrically connecting a base electrode node of a corresponding bipolar transistor to a corresponding storage node when rendered conductive;

writing means activated when data is written to said memory cell, for driving each bit line of said pair of bit lines to a second power supply voltage level different from said first power supply voltage; and a bit line precharge circuit coupled to each bit line of said pair of bit lines and activated upon activation of a bit line precharge instruction signal, for precharging said bit lines to a prescribed potential level between an intermediate potential which in turn is between said first power supply potential and said second power supply potential and said first power supply potential, a difference between said intermediate potential and said first power supply voltages substantially equal to a built-in voltage between the one conduction node and the base electrode node of the bipolar transistor.

2. The semiconductor memory device according to claim 1, wherein said bit line precharge circuit includes a pair of switching transistors provided corresponding to each bit line of said pair of bit lines and rendered conductive upon activation of said bit line precharge instruction signal, and a diode-mode transistor connected between said pair of switching transistors and said first voltage source and operating in a diode mode, for generating a forward voltage drop of said prescribed potential level.

3. The semiconductor memory device according to claim 2, wherein the switching transistors and said diode mode transistor are insulated gate type field effect transistors of a same conductivity type.

4. The semiconductor memory device according to claim 2, wherein the switching transistors each comprises an insulated gate type field effect transistor of a first conductivity type, and said diode mode transistor comprises an insulated gate type field effect transistor of a second conductivity type.

5. The semiconductor memory device according to claim 1, wherein said bit line precharge circuit includes insulated gate type field effect transistors connected between respective bit lines of said pair of bit lines and said first voltage source and rendered conductive in response to said bit line precharge instruction signal received at a gate thereof said bit line precharge instruction signal being driven to said first power supply voltage level when activated.

6. The semiconductor memory device according to claim 1, wherein said bit line precharge circuit includes bipolar transistors connected between respective bit lines of said pair of bit lines and said first voltage source and receiving said bit line precharge instruction signal at a base electrode node thereof, said bit line precharge instruction signal being driven to said first power supply voltage level to render said bipolar transistor conductive when activated.

7. The semiconductor memory device according to claim 6, wherein the bipolar transistors of said precharge circuit has a common electrical characteristic to that of the bipolar transistors of said memory cell.

8. The semiconductor memory device according to claim 1, wherein said bit line precharge circuit includes a pair of diodes connected between respective bit lines of said pair of bit lines and a common node receiving said bit line precharge instruction signal, said bit line precharge instruction signal on said common node being driven to said first power supply voltage level when activated.

9. The semiconductor memory device according to claim 1, wherein said bit line precharge circuit includes a pair of switching transistors provided between each respective bit line of said pair of bit lines and a common node and rendered conductive upon activation of said bit line precharge instruction signal, and a diode element connected between said common node and said first voltage source and generating a forward voltage drop substantially equal to said prescribed potential.

10. The semiconductor memory device according to claim 1, wherein said bit line precharge circuit includes means provided corresponding to each bit line of said pair of bit lines and activated upon activation of said bit line precharged instruction signal, for causing a potential level shift of said prescribed potential level between each respective bit line and said first voltage source.

11. A semiconductor memory device, comprising:

a plurality of bit lines arranged in pairs;

a plurality of word lines each having first and second sub-word lines and arranged crossing the pairs of bit lines; and a plurality of memory cells arranged corresponding to crossings of said pairs of bit lines and said plurality of word lines, said plurality of memory cells each including
  (i) a cross-coupled type flipflop including cross-coupled insulated gate type field effect transistors for storing complementary data in a pair of storage nodes,
  (ii) a pair of bipolar transistors connected between each respective bit line of a corresponding pair of bit lines and a voltage source supplying a first power supply voltage, and
  (iii) a pair of access transistors provided corresponding to said first and second sub-word lines of a corresponding word line and said pair of storage nodes and rendered selectively conductive in response to signal potentials of corresponding first and second sub-word lines to electrically connect corresponding storage nodes, respectively, to base electrode nodes of corresponding bipolar transistors; and bit line precharge means coupled to each of said pairs of bit lines and activated in response to activation of a bit line precharge instruction signal for precharging each bit line of each of said pairs of bit lines to a prescribed potential, said prescribed potential being at a potential level between said first power supply voltage and a built-in voltage, relative to said first power supply voltage, of each of said bipolar transistors.

12. The semiconductor memory device according to claim 11, wherein said bit line precharge means includes a plurality of switching elements each provided corresponding to each respective bit line of said pairs of bit lines and rendered conductive to connect a corresponding bit line to a global common node provided commonly to each respective bit line of said pairs of bit lines in response to activation of said bit line precharge instruction signal, and a level shift element coupled between said global common node and said first voltage source and operating in a diode mode for causing a level shift of said prescribed potential level.

13. The semiconductor memory device according to claim 12, wherein said level shift element comprises an insulated gate type field effect transistor operating in the diode mode.

14. The semiconductor memory device according to claim 12, wherein said level shift element comprises a bipolar transistor operating in the diode mode.

15. The semiconductor memory device according to claim 14, wherein the bipolar transistor of said level shift element has a same electrical characteristic as that of the bipolar transistors of the memory cells.

16. The semiconductor memory device according to claim 12, wherein said level shift element includes a PN diode.

17. The semiconductor memory device according to claim 11, wherein said bit line precharge means includes a plurality of unit precharge circuits provided for each of said pairs of bit lines, and the unit precharge circuits each include first and second switching transistors provided between each respective bit line of a corresponding bit line pair and a common node and rendered conductive in response to activation of said bit line precharge instruction signal, and a level shift element connected between said common node and said first voltage source and operating in the diode mode for causing a level shift of said prescribed potential between said common node and said first voltage source.

18. The semiconductor memory device according to claim 11, wherein the bit line precharge means includes precharge circuits provided corresponding to each of said paired bit lines, and said precharge circuits each includes insulated gate type field effect transistors connected between each respective bit line of a corresponding bit line pair and said first voltage source and receiving said bit line precharge instruction signal at gates thereof, said bit line precharge instruction signal being driven to said first power supply voltage level when activated.

19. The semiconductor memory device according to claim 11, wherein said bit line precharge means includes precharge circuits provided corresponding to said pairs of bit lines, and said precharge circuits each include bipolar transistors connected between each respective bit line of a corresponding bit line pair and said first voltage source and receiving said bit line precharge instruction signal at base electrode nodes thereof, said bit line precharge instruction signal being driven to said first power supply voltage level when activated.

20. The semiconductor memory device according to claim 11, wherein said bit line precharge means includes a plurality of precharge circuits provided corresponding to each of said paired bit lines, and said precharge circuits each include first and second diode elements connected between each respective bit line of a corresponding pair of bit lines and a common node and causing, when rendered conductive, a level shift of said prescribed potential between the corresponding bit line and said common node, said bit line precharge instruction signal being applied to said common node and being driven to said first power supply voltage level when activated.

* * * * *